United States Patent
Ji et al.

(10) Patent No.: US 12,289,953 B2
(45) Date of Patent: Apr. 29, 2025

(54) DISPLAY APPARATUS

(71) Applicant: Samsung Display Co., Ltd., Yongin-si (KR)

(72) Inventors: Miran Ji, Yongin-si (KR); Hyeonbum Lee, Yongin-si (KR); Chiwook An, Yongin-si (KR); Haeyoung Yun, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 353 days.

(21) Appl. No.: 17/331,122

(22) Filed: May 26, 2021

(65) Prior Publication Data

US 2022/0140288 A1    May 5, 2022

(30) Foreign Application Priority Data

Oct. 29, 2020    (KR) .................. 10-2020-0142520

(51) Int. Cl.
*H10K 50/858*   (2023.01)
*G06F 3/041*    (2006.01)
(Continued)

(52) U.S. Cl.
CPC ......... *H10K 50/858* (2023.02); *G06F 3/0412* (2013.01); *H10K 50/844* (2023.02);
(Continued)

(58) Field of Classification Search
CPC .. H10K 50/858; H10K 50/865; H10K 50/844; H10K 59/40; H10K 59/38;
(Continued)

(56) References Cited

U.S. PATENT DOCUMENTS 8,081,374 B2    12/2011  Lee et al.
10,534,214 B2    1/2020  Chen
(Continued)

FOREIGN PATENT DOCUMENTS

CN    1721922       1/2006
KR    10-1566433    11/2015
(Continued)

*Primary Examiner* — Angela M. Medich
(74) *Attorney, Agent, or Firm* — KILE PARK REED & HOUTTEMAN PLLC

(57) ABSTRACT

A display apparatus includes a display element including an emission area, a thin-film encapsulation layer disposed on the display element, a first insulating layer disposed on the thin-film encapsulation layer, the first insulating layer including an opening that corresponds to the emission area, and a refraction area defined by the opening and including an organic material, and a second insulating layer disposed on the first insulating layer, filling the refraction area, and having a refractive index greater than a refractive index of the first insulating layer, wherein the display element includes a first display element and a second display element, and the refraction area has a circular shape or an elliptical shape in a plan view and includes a first refraction area corresponding to the first display element and a second refraction area corresponding to the second display element.

13 Claims, 15 Drawing Sheets

(51) Int. Cl.
   *H10K 50/844* (2023.01)
   *H10K 59/38* (2023.01)
   *H10K 59/40* (2023.01)
   *H10K 50/86* (2023.01)
   *H10K 59/12* (2023.01)

(52) U.S. Cl.
   CPC ............. *H10K 59/38* (2023.02); *H10K 59/40* (2023.02); *H10K 50/865* (2023.02); *H10K 59/12* (2023.02)

(58) Field of Classification Search
   CPC .. H10K 59/121; H10K 59/352; H10K 59/353; G06F 3/0412
   See application file for complete search history.

(56) References Cited

U.S. PATENT DOCUMENTS

| | | | |
|---|---|---|---|
| 2014/0027725 A1* | 1/2014 | Lim | H10K 50/865 257/40 |
| 2017/0213882 A1* | 7/2017 | Teramoto | H10K 59/121 |
| 2018/0188866 A1 | 7/2018 | Heo et al. | |
| 2019/0013495 A1 | 1/2019 | Kim et al. | |
| 2019/0115404 A1 | 4/2019 | Moon et al. | |
| 2019/0165061 A1* | 5/2019 | Jung | H10K 50/858 |
| 2019/0245017 A1 | 8/2019 | Jeon et al. | |
| 2019/0252470 A1 | 8/2019 | Lee | |
| 2020/0227489 A1 | 7/2020 | Kim et al. | |
| 2020/0273924 A1 | 8/2020 | Xiao et al. | |
| 2022/0199698 A1 | 6/2022 | Son et al. | |

FOREIGN PATENT DOCUMENTS

| | | |
|---|---|---|
| KR | 10-2016-0038628 | 4/2016 |
| KR | 10-2019-0004863 | 1/2019 |
| KR | 10-2019-0041558 | 4/2019 |
| KR | 10-2019-0062678 | 6/2019 |
| KR | 10-2019-0095630 | 8/2019 |
| KR | 10-2020-0073338 | 6/2020 |
| KR | 10-2020-0089379 | 7/2020 |

* cited by examiner

DISPLAY APPARATUS

CROSS-REFERENCE TO RELATED APPLICATION(S)

This application claims priority to and the benefit of Korean Patent Application No. 10-2020-0142520 under 35 U.S.C. §119, filed on Oct. 29, 2020, in the Korean Intellectual Property Office (KIPO), the entire contents of which are incorporated herein by reference.

BACKGROUND

1. Technical Field

One or more embodiments relate to a display apparatus.

2. Description of Related Art

Recently, the usage of display apparatuses has diversified. In addition, as display apparatuses become thinner and lighter, the uses of display apparatuses have expanded. As display apparatuses are used in various fields, demand for display apparatuses that provide high-quality images has increased.

SUMMARY

One or more embodiments include a display apparatus in which light efficiency may be improved to provide a high-quality image. However, such a technical problem is an example, and the disclosure is not limited thereto.

Additional aspects will be set forth in part in the description which follows and, in part, will be apparent from the description, or may be learned by practice of the presented embodiments of the disclosure.

According to one or more embodiments, a display apparatus may include a display element disposed on a substrate and including an emission area, a thin-film encapsulation layer disposed on the display element, the thin-film encapsulation layer including at least one inorganic encapsulation layer and at least one organic encapsulation layer, a first insulating layer disposed on the thin-film encapsulation layer, the first insulating layer including an opening that corresponds to the emission area, and a refraction area defined by the opening and including an organic material, and a second insulating layer disposed on the first insulating layer, filling the refraction area, and having a refractive index greater than a refractive index of the first insulating layer. The display element may include a first display element and a second display element, the refraction area may have a circular shape, a polygonal shape having eight or more sides, or an elliptical shape in a plan view, the refraction area including a first refraction area corresponding to the first display element and a second refraction area corresponding to the second display element. The first refraction area and the second refraction area may be different in at least one of a relative size to a corresponding emission area, a shape, and an arrangement.

The emission area may have a circular shape or a polygonal shape having eight or more sides in a plan view.

The first refraction area and the second refraction area may have an elliptical shape in a plan view, and a direction of a long axis of the first refraction area and a direction of a long axis of the second refraction area may be different from each other.

A relative area of the first refraction area to an emission area of the first display element may be greater than 1, and a relative area of the second refraction area to an emission area of the second display element may be less than 1.

The first refraction area and the second refraction area may have a circular shape or a polygonal shape having eight or more sides in a plan view, a relative area of the first refraction area to an emission area of the first display element may be greater than 1, and a relative area of the second refraction area to an emission area of the second display element may be less than 1.

The first refraction area and the second refraction area may be alternately disposed in a direction.

The display apparatus may further include an anti-reflection layer including a color filter overlapping the emission area and a black matrix overlapping a non-emission area outside the emission area, wherein a width of an area where the color filter is disposed may be greater than a width of the emission area.

The color filter may be disposed in an opening of the black matrix, and the opening of the black matrix may have a circular shape or a polygonal shape having eight or more sides in a plan view.

The display apparatus may further include a touch-sensing layer disposed between the thin-film encapsulation layer and the second insulating layer, the touch-sensing layer including a conductive layer.

The first insulating layer may include an inclined surface that surrounds at least a portion of the opening of the first insulating layer.

A center of the first refraction area may not be aligned with a center of an emission area of the first display element.

According to one or more embodiments, a display apparatus may include a display element disposed on a substrate and including an emission area, a thin-film encapsulation layer disposed on the display element, and the thin-film encapsulation layer including at least one inorganic encapsulation layer and at least one organic encapsulation layer, a touch-sensing layer disposed on the thin-film encapsulation layer and including a conductive layer, an anti-reflection layer disposed on the touch-sensing layer, the anti-reflection layer comprising a color filter corresponding to the emission area; and a black matrix adjacent to the color filter, a first insulating layer disposed on the touch-sensing layer, the first insulating layer including an opening that corresponds to the emission area, and a refraction area defined by the opening and including an organic material, and a second insulating layer disposed on the first insulating layer, filling the refraction area, and having a refractive index greater than a refractive index of the first insulating layer. The color filter may fill an opening of the black matrix and extend to an upper surface of the black matrix, the emission area and the opening of the black matrix have a circular shape or a polygonal shape having eight or more sides in a plan view.

The refraction area may have an elliptical shape in a plan view, and a length of a long axis of the refraction area may be greater than a diameter of the emission area.

The refraction area may have an elliptical shape in a plan view, and a length of a long axis of the refraction area may be equal to or less than a diameter of the emission area.

A width of an area where the color filter is disposed may be greater than a width of the emission area.

The display element may include a first display element and a second display element. The refraction area may have a circular shape, a polygonal shape having eight or more sides, or an elliptical shape in a plan view, the refraction area including a first refraction area corresponding to the first display element and a second refraction area corresponding to the second display element. The first refraction area and the second refraction area are different in at least one of a relative size to the corresponding emission area, a shape, and an arrangement.

The first refraction area and the second refraction area may have an elliptical shape in a plan view, and a direction of a long axis of the first refraction area and a direction of a long axis of the second refraction area may be different from each other.

The first refraction area and the second refraction area may have a circular shape or a polygonal shape having eight or more sides in a plan view, a relative area of the first refraction area to an emission area of the first display element may be greater than 1, and a relative area of the second refraction area to an emission area of the second display element may be less than 1.

The first refraction area and the second refraction area may be alternately disposed in a first direction.

The first insulating layer may include an inclined surface that surrounds at least a portion of the opening of the first insulating layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
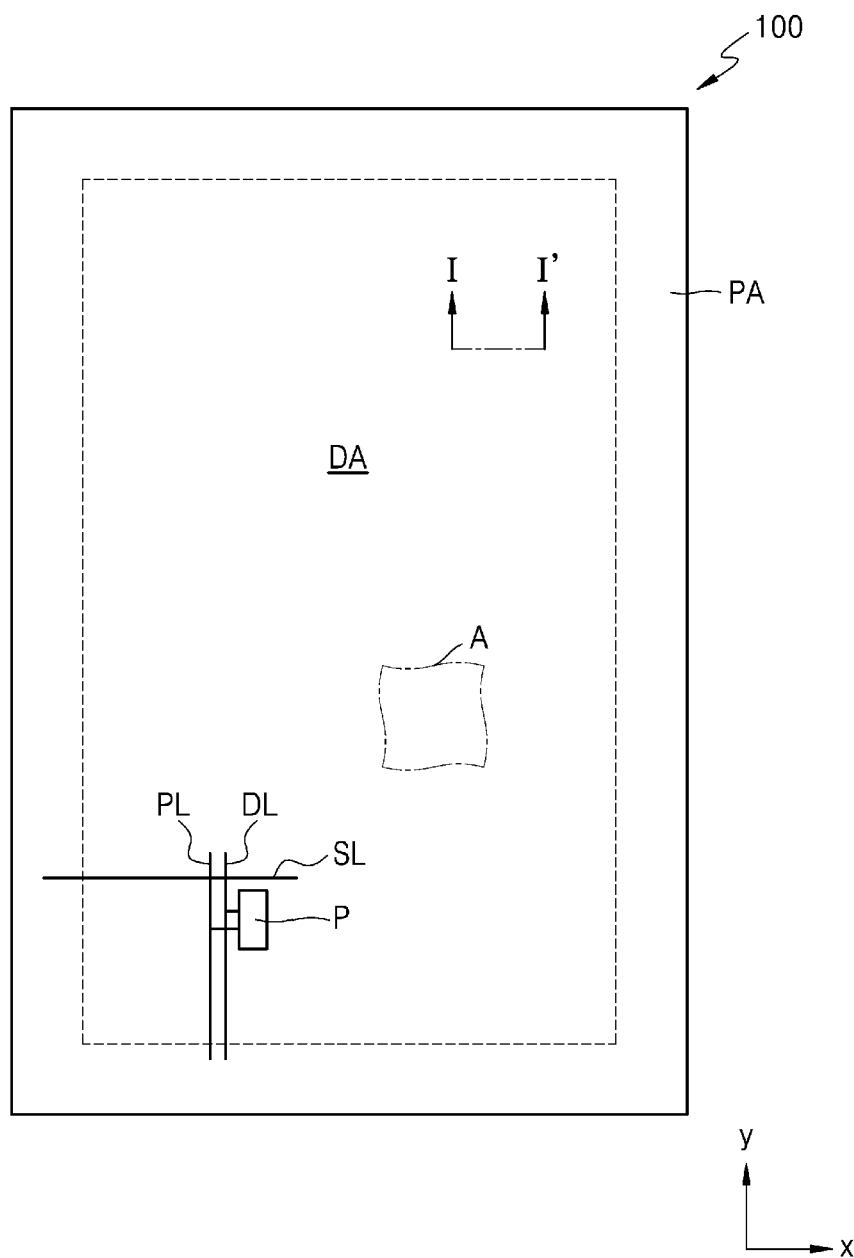
FIG. 1 is a schematic plan view of a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description. As used herein, the term "and/or" includes any and all combinations of one or more of the associated listed items. Throughout the disclosure, the expression "at least one of a, b and c" indicates only a, only b, only c, both a and b, both a and c, both b and c, all of a, b, and c, or variations thereof.

As the description allows for various changes and numerous embodiments, certain embodiments will be illustrated in the drawings and described in the written description. Effects and features of one or more embodiments and methods of accomplishing the same will become apparent from the following detailed description of the one or more embodiments, taken in conjunction with the accompanying drawings. However, the embodiments may have different forms and should not be construed as being limited to the descriptions set forth herein.

One or more embodiments will be described below in more detail with reference to the accompanying drawings. Those elements that are the same or are in correspondence with each other are rendered the same reference numeral regardless of the figure number, and redundant descriptions thereof are omitted.

While such terms as "first" and "second" may be used to describe various elements, such elements must not be limited to the above terms. The above terms are used to distinguish one element from another.

The singular forms "a," "an," and "the" as used herein are intended to include the plural forms as well unless the context clearly indicates otherwise.

It will be understood that the terms "include," "comprise," and "have" as used herein specify the presence of stated features or elements but do not preclude the addition of one or more other features or elements.

It will be further understood that, when a layer, region, or element is referred to as being "on" another layer, region, or element, it may be directly or indirectly on the other layer, region, or element. That is, for example, one or more intervening layers, regions, or elements may be present.

Sizes of elements in the drawings may be exaggerated or reduced for convenience of explanation. In other words, since sizes and thicknesses of elements in the drawings are arbitrarily illustrated for convenience of explanation, the following embodiments are not limited thereto.

It will be further understood that, when layers, regions, or elements are referred to as being connected to each other, they may be directly connected to each other or indirectly connected to each other with one or more intervening layers, regions, or elements therebetween. For example, when layers, regions, or elements are referred to as being electrically connected to each other, they may be directly electrically connected to each other or indirectly electrically connected to each other with intervening layers, regions, or elements therebetween.

The x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

As used herein, the expression "A and/or B" refers to A, B, or A and B.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Referring to FIG. 1, a substrate 100 of a display apparatus 10 may be divided into a display area DA and a peripheral area PA around the display area DA. The display apparatus may provide an image by using light emitted from pixels P arranged in the display area DA.

Each pixel P may include a display element such as an organic light-emitting diode or an inorganic light-emitting diode and may emit, for example, red, green, blue, or white light. For example, each pixel P may be electrically connected to a pixel circuit including a thin-film transistor and a storage capacitor. The pixel circuit may be electrically connected to a scan line SL, a data line DL intersecting the scan line SL, and a driving voltage line PL. The scan line SL may extend in a direction x, and the data line DL and the driving voltage line PL may extend in a direction y.

Each pixel P may emit light according to driving of the pixel circuit, and the display area DA may provide an image through light emitted from the pixels P. A pixel P described herein may be defined as an emission area that emits light of one of red, green, blue, and white colors as described above.

The peripheral area PA may be an area in which a pixel P is not arranged and provides no image. An embedded driving circuit portion for driving the pixels P, a power supply line, and a terminal portion to which a printed circuit board including a driving circuit portion or a driver IC is electrically connected may be arranged in the peripheral area PA.

A display apparatus 10 according to an embodiment may include an organic light-emitting display apparatus, an inorganic light-emitting display apparatus (or an inorganic electroluminescent (EL) display apparatus), a quantum dot display apparatus, or the like. Although an organic light-emitting display apparatus is described below as an example of a display apparatus according to an embodiment, a display apparatus of the disclosure is not limited thereto, and features described below may be applied to various display apparatuses described above.

Figure 2:
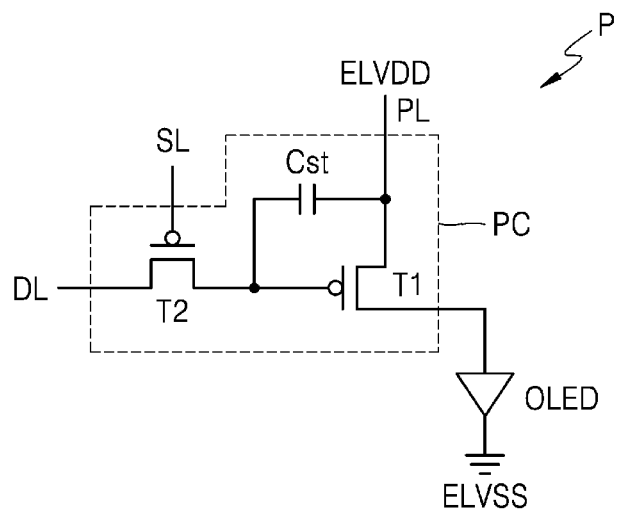
FIG. 2 is a schematic circuit diagram illustrating a display element and a pixel circuit connected thereto, which are included in a pixel of a display apparatus according to an embodiment.

FIG. 2 illustrates a display element and a pixel circuit PC electrically connected thereto, which are included in a pixel P of a display apparatus according to an embodiment.

Referring to FIG. 2, an organic light-emitting diode OLED, which is a display element, may be electrically connected to the pixel circuit PC. The pixel circuit PC may include a first thin-film transistor T1, a second thin-film transistor T2, and a storage capacitor Cst. The organic light-emitting diode OLED, for example, may emit red, green, or blue light, or may emit red, green, blue, or white light.

The second thin-film transistor T2 may be a switching thin-film transistor electrically connected to the scan line SL and the data line DL and may transmit a data voltage, input from the data line DL, to the first thin-film transistor T1 according to a switching voltage input from the scan line SL. The storage capacitor Cst may be electrically connected to the second thin-film transistor T2 and the driving voltage line PL and may store a voltage corresponding to a difference between a voltage, received from the second thin-film transistor T2, and a first power supply voltage ELVDD supplied to the driving voltage line PL.

The first thin-film transistor T1 may be a driving thin-film transistor electrically connected to the driving voltage line PL and the storage capacitor Cst, and may control a driving current flowing through the organic light-emitting diode OLED from the driving voltage line PL in response to a voltage value stored in the storage capacitor Cst. The organic light-emitting diode OLED may emit light having a brightness according to the driving current. A second power supply voltage ELVSS may be supplied to an opposite electrode of the organic light-emitting diode OLED, e.g., a cathode.

FIG. 2 illustrates the pixel circuit PC including two thin-film transistors and a storage capacitor. However, in an embodiment, the number of thin-film transistors or the number of storage capacitors may be changed in various ways according to a design of the pixel circuit PC.

Figure 3:
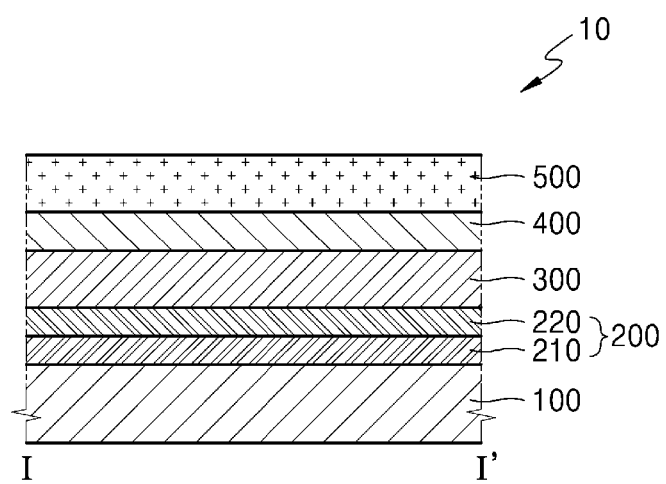
FIG. 3 is a schematic cross-sectional view of a display apparatus according to embodiments.

Referring to FIG. 3, a display layer 200 may be arranged on the substrate 100, and a thin-film encapsulation layer 300, a touch-sensing layer 400, and an optical layer 500 may be arranged on the display layer 200.

The substrate 100 may include polymer resin or a glass material. The substrate 100 including polymer resin may be flexible, rollable, or bendable. The display layer 200 may include a display element layer 220 including display elements and a pixel circuit layer 210 including pixel circuits respectively and electrically connected to the display elements. Each of the display elements included in the display element layer 220 may define a pixel, and the pixel circuit layer 210 may include transistors and storage capacitors.

The thin-film encapsulation layer 300 may be arranged on the display layer 200. The thin-film encapsulation layer 300 may prevent the display elements from being damaged by external foreign materials such as moisture. The thin-film encapsulation layer 300 may include at least one inorganic thin-film encapsulation layer and at least one organic thin-film encapsulation layer.

The touch-sensing layer 400 may be arranged on the thin-film encapsulation layer 300. The touch-sensing layer 400 may be a layer for sensing a user's touch input and may sense the user's touch input by using at least one of various touch methods such as a resistive overlay method and a capacitive overlay method.

The optical layer 500 may be arranged on the touch-sensing layer 400. The optical layer 500 may be a layer having a structure for improving emission efficiency of light emitted from the display elements. The optical layer 500 may include two layers having different refractive indexes from each other to improve optical performance. In some embodiments, the optical layer 500 may share some elements with the touch-sensing layer 400.

An anti-reflection layer may be arranged between the optical layer 500 and the touch-sensing layer 400. The anti-reflection layer may decrease reflectance of light (e.g., external light) incident from the outside toward a display apparatus 10. In some embodiments, the anti-reflection layer may include a black matrix and a color filter.

An anti-reflection layer and/or a cover window may be arranged on the optical layer 500. The anti-reflection layer may include a polarizing film. In case that the anti-reflection layer including a polarizing film is arranged on the optical layer 500, an anti-reflection layer arranged under the optical layer 500 may be omitted. The cover window may be attached to the anti-reflection layer by a transparent adhesive member such as an optically clear adhesive film.

Figure 4A:
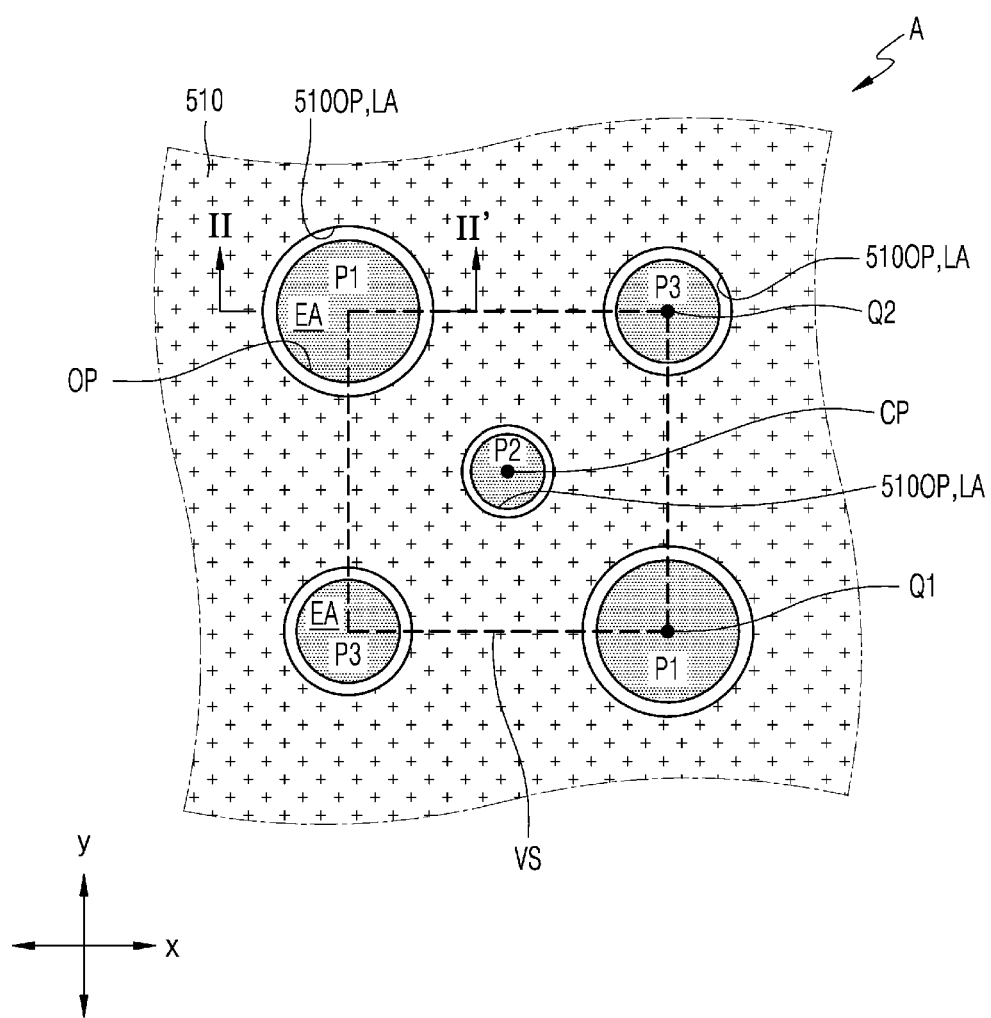
FIG. 4A is a schematic enlarged plan view of some elements that may be included in area A of FIG. 1 according to an embodiment.
Figure 4B:
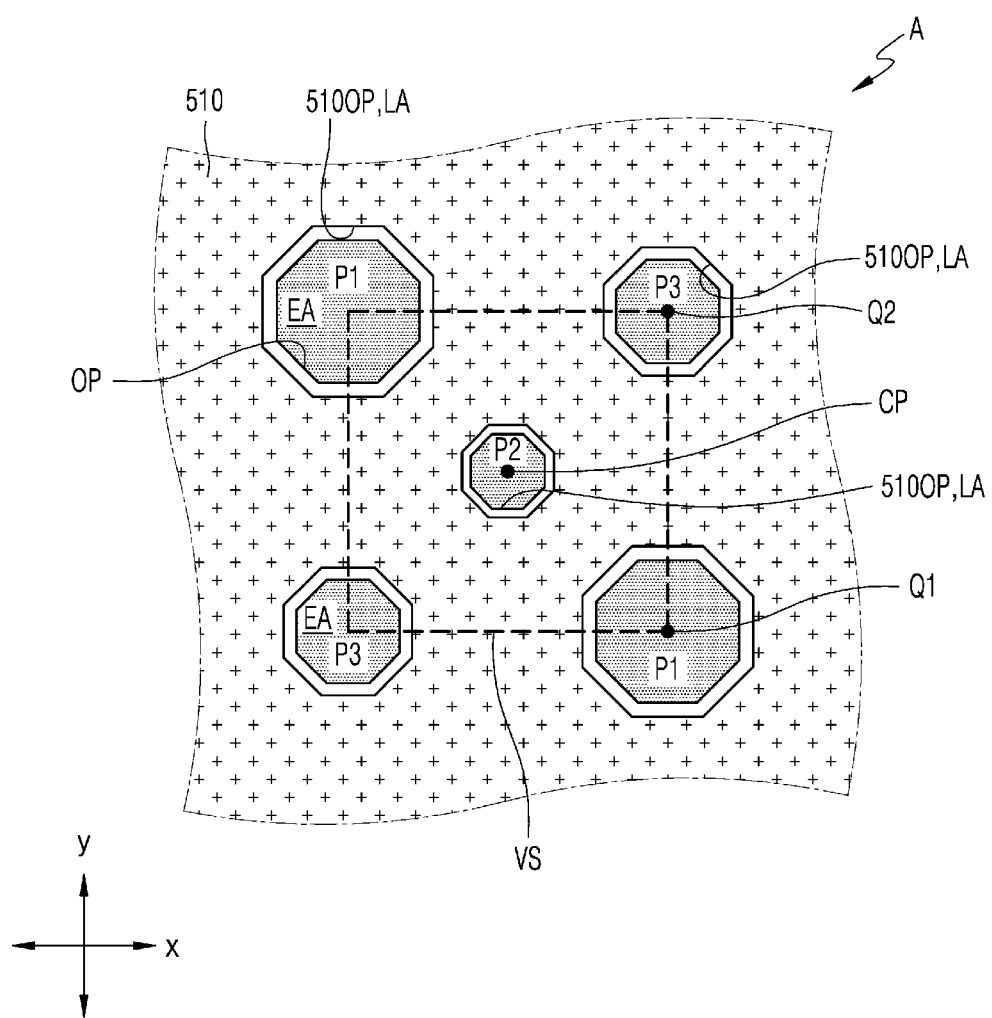
FIG. 4B is a schematic enlarged plan view of some elements that may be included in area A of FIG. 1 according to an embodiment.

Each of FIGS. 4A and 4B is a schematic enlarged plan view of some elements that may be included in area A of the display apparatus of FIG. 1 according to an embodiment and schematically illustrates an arrangement relationship between pixels and a refraction area LA corresponding to an emission area (or light emission area) EA of each pixel.

Referring to FIGS. 4A and 4B, a display apparatus may include pixels, and the pixels may include a first pixel P1, a second pixel P2, and a third pixel P3 emitting different colors from one another. For example, the first pixel P1 may emit blue light, the second pixel P2 may emit green light, and the third pixel P3 may emit red light. However, the disclosure is not limited thereto. Various modifications may be made, and for example, the first pixel P1 may emit red light, the second pixel P2 may emit green light, and the third pixel P3 may emit blue light.

In the embodiment, as shown in FIG. 4A, emission areas EA of the first pixel P1, the second pixel P2, and the third pixel P3 may have a circular shape. As another example, as shown in FIG. 4B, the emission areas EA of the first pixel P1, the second pixel P2, and the third pixel P3 may have a polygonal shape with eight or more sides. For example, the emission areas EA of the first pixel P1, the second pixel P2, and the third pixel P3 may have a shape close to a circular shape. A polygonal shape described herein may also include a shape with rounded vertices. For example, the emission areas EA of the first pixel P1, the second pixel P2, and the third pixel P3 may have a polygonal shape with eight or more sides in which vertices are rounded.

Figure 5A:
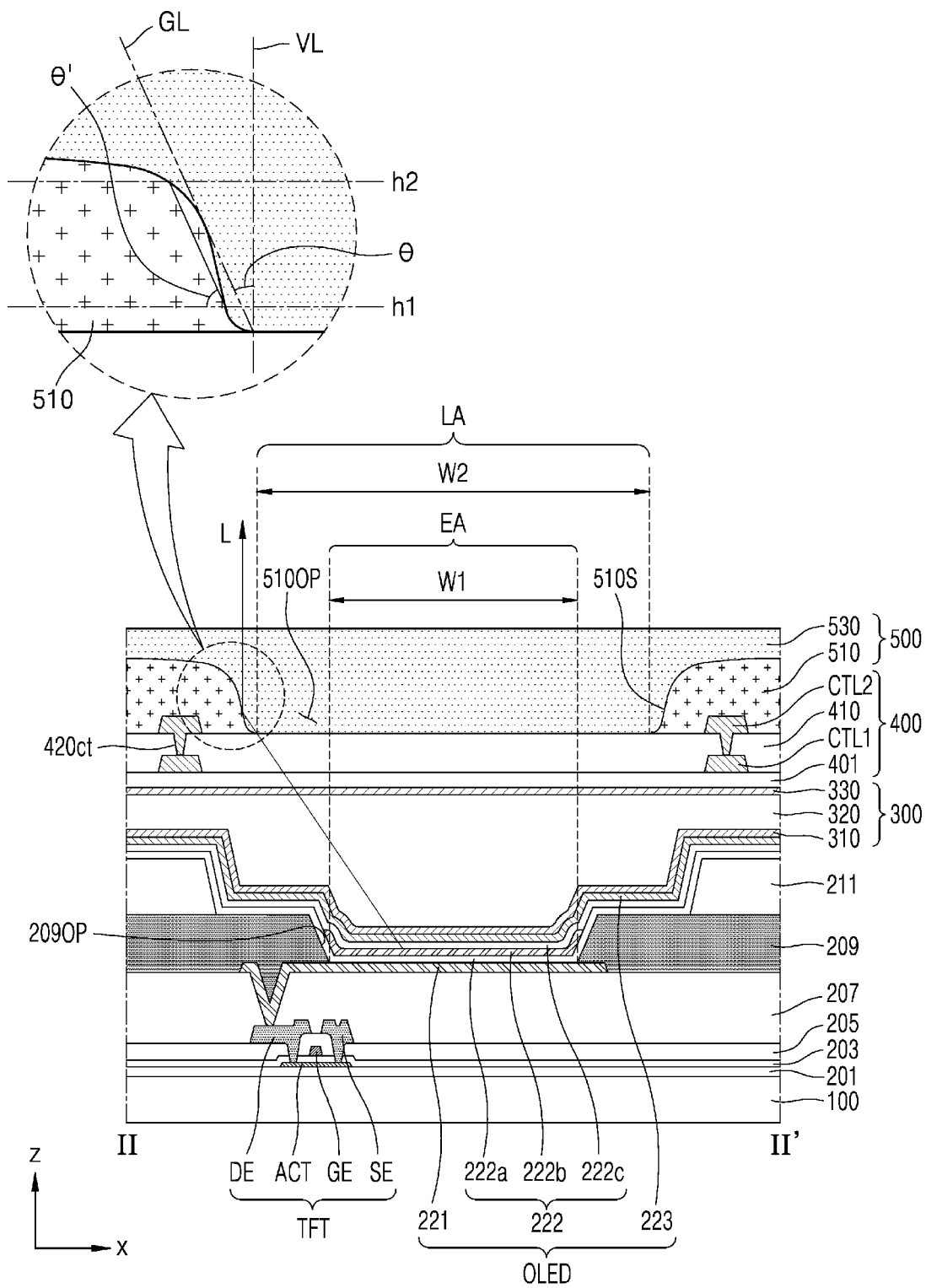
FIG. 5A is a schematic cross-sectional view of a display apparatus according to an embodiment.

The emission areas EA of the first pixel P1, the second pixel P2, and the third pixel P3 may be defined by a second opening 209OP of a pixel-defining layer 209 (refer to FIG. 5A). Light incident from the outside may be reflected by the side of the second opening 209OP and be diffracted. In case that a shape of the second opening 209OP is a polygonal shape having fewer than eight sides, light incident from the outside may be diffracted in a certain direction according to the shape of the opening 209OP.

In the embodiment, as the emission areas EA of the first pixel P1, the second pixel P2, and the third pixel P3 have a circular shape or a polygonal shape with eight or more sides close to a circular shape, the diffraction due to reflection of external light in a certain direction may be reduced.

Sizes of the emission areas EA of the first pixel P1, the second pixel P2, and the third pixel P3 may be different from one another. For example, an area of the emission area EA of the second pixel P2 may be less than areas of the emission area EA of the first pixel P1 and the emission area EA of the third pixel P3, and the area of the emission area EA of the first pixel P1 may be greater than the area of the emission area EA of the third pixel P3. However, the disclosure is not limited thereto. Various modifications may be made. For example, sizes of the emission areas EA of the first pixel P1, the second pixel P2, and the third pixel P3 may be substantially the same as one another.

A display apparatus according to the embodiment may include the refraction area LA corresponding to each of the pixels, for example, the first to third pixels P1, P2, and P3. The refraction area LA may be an area defined by a first opening 510OP where a portion of a first insulating layer 510 has been removed, and an inner wall of the opening 510OP of the first insulating layer 510 may have an inclined structure. The first opening 510OP of the first insulating layer 510 may be filled with a second insulating layer 530 (refer to FIG. 5A) having a high refractive index. The inner wall of the first opening 510OP of the first insulating layer 510 may reflect light emitted from each of the first to third pixels P1, P2, and P3, thereby improving front light efficiency of the display apparatus.

In a plan view, the refraction area LA may correspond to the emission area EA of each of the first to third pixels P1, P2, and P3. In some embodiments, the refraction area LA may have a polygonal shape close to a circular shape, a circular shape, or an elliptical shape.

As shown in FIGS. 4A and 4B, the first pixel P1, the second pixel P2, and the third pixel P3 may be arranged in a pixel array having a PenTile® structure.

For example, the first pixel P1 may be arranged at a first vertex Q1 of a virtual quadrilateral VS having a center point CP of the second pixel P2 as a center point of the virtual quadrilateral VS, and the third pixel P3 may be arranged at a second vertex Q2 of the virtual quadrilateral VS. The virtual quadrilateral VS may be a square.

The first pixel P1 may be spaced apart from the second pixel P2 and may have a center point at the first vertex Q1 of the virtual quadrilateral VS. The first pixel P1 may include multiple first pixels P1, and the first pixels P1 may be spaced apart from each other with the second pixel P2 therebetween.

The third pixel P3 may be spaced apart from the first pixel P1 and the second pixel P2 and may have a center point at the second vertex Q2 neighboring the first vertex Q1 of the virtual quadrilateral VS. The third pixel P3 may include multiple third pixels P3, and the third pixels P3 may be spaced apart from each other with the first pixel P1 therebetween.

Each of the first pixels P1 and the third pixels P3 may be alternately arranged in direction x and direction y intersecting direction x. The first pixel P1 may be surrounded by second pixels P2 and the third pixels P3.

Although FIGS. 4A and 4B illustrate that arrangement of the first pixel P1, the second pixel P2, and the third pixel P3 has a PenTile® structure, the disclosure is not limited thereto. For example, the first pixel P1, the second pixel P2, and the third pixel P3 may be arranged in various structures such as a stripe structure, a mosaic structure, and a delta structure.

Hereinafter, a display apparatus according to an embodiment will be described in more detail according to a stacking sequence shown in FIG. 5A.

FIG. 5A is a schematic cross-sectional view of a display apparatus according to an embodiment, taken along line II-II' of FIG. 4A.

Referring to FIG. 5A, a display apparatus according to an embodiment may include the organic light-emitting diode OLED provided on the substrate 100 and including the emission area EA, the thin-film encapsulation layer 300, the first insulating layer 510 including the refraction area LA, and the second insulating layer 530 filling the refraction area LA.

The substrate 100 may have a single-layer structure including a glass material. As another example, the substrate 100 may include polymer resin. The substrate 100 including polymer resin may have a structure in which a layer including polymer resin and an inorganic layer are stacked. According to an embodiment, the substrate 100 may include polymer resin such as polyethersulfone, polyarylate, polyetherimide, polyethylene naphthalate, polyethylene terephthalate, polyphenylene sulfide, polyimide, polycarbonate, cellulose triacetate, and/or cellulose acetate propionate, and the substrate 100 may be flexible. The substrate 100 may include glass mainly including $SiO_2$ or may include resin such as reinforced plastic and may be rigid.

A thin-film transistor TFT may include a semiconductor layer Act including amorphous silicon, polycrystalline silicon, or an organic semiconductor material, a gate electrode GE, a source electrode SE, and a drain electrode DE. To secure insulation between the semiconductor layer Act and the gate electrode GE, a gate insulating layer 203 including an inorganic material such as silicon oxide, silicon nitride, and/or silicon oxynitride may be arranged between the semiconductor layer Act and the gate electrode GE. An interlayer insulating layer 205 including an inorganic material such as silicon oxide, silicon nitride and/or silicon oxynitride may be arranged on the gate electrode GE, and the source electrode SE and the drain electrode DE may be arranged on the interlayer insulating layer 205 described above. The insulating layer including an inorganic material may be formed by chemical vapor deposition (CVD) or atomic layer deposition (ALD).

The gate electrode GE, the source electrode SE, and the drain electrode DE may include various conductive materials. The gate electrode GE may include at least one of molybdenum, aluminum, copper, and titanium, and if necessary, may have a multilayer structure. For example, the gate electrode GE may have a single-layer structure including molybdenum or may have a three-layer structure including a molybdenum layer, an aluminum layer, and a molybdenum layer. The source electrode SE and the drain electrode DE may include at least one of copper, titanium, and aluminum, and if necessary, may have a multilayer structure. For example, the source electrode SE and the drain electrode DE may have a three-layer structure including a titanium layer, an aluminum layer, and a titanium layer.

A buffer layer 201 including an inorganic material such as silicon oxide, silicon nitride, and/or silicon oxynitride may be arranged between the thin-film transistor TFT having such a structure and the substrate 100. The buffer layer 201 may increase the smoothness of an upper surface of the substrate 100 or may prevent or reduce penetration of impurities from the substrate 100 or the like into the semiconductor layer Act of the thin-film transistor TFT.

A planarization insulating layer 207 may be arranged on the thin-film transistor TFT. The planarization insulating layer 207 may include, for example, an organic material such as acryl, benzocyclobutene (BCB), or hexamethyldisiloxane (HMDSO). FIG. 5A illustrates that the planarization insulating layer 207 is a single-layer structure, but the planarization insulating layer 207 may have a multi-layer structure.

A pixel electrode 221 may be arranged on the planarization insulating layer 207. The pixel electrode 221 may be arranged for each pixel. Pixel electrodes 221 respectively corresponding to neighboring pixels may be spaced apart from each other.

The pixel electrode 221 may be a reflective electrode. In some embodiments, the pixel electrode 221 may include a reflective film including silver (Ag), magnesium (Mg), aluminum (Al), platinum (Pt), palladium (Pd), gold (Au), nickel (Ni), neodymium (Nd), iridium (Ir), chromium (Cr), and a compound thereof, and a transparent or semi-transparent electrode layer on the reflective film. The transparent or semi-transparent electrode layer may include at least one selected from the group including indium tin oxide (ITO), indium zinc oxide (IZO), zinc oxide (ZnO), indium oxide ($In_2O_3$), indium gallium oxide (IGO), and aluminum zinc oxide (AZO). In some embodiments, the pixel electrode 221 may have a three-layer structure including an ITO layer, an Ag layer, and an ITO layer.

The pixel-defining layer 209 may be arranged on the pixel electrode 221. The pixel-defining layer 209 may have the second opening 209OP exposing a central portion of each pixel electrode 221. The pixel-defining layer 209 may cover or overlap the edge of the pixel electrode 221 and increase a distance between the edge of the pixel electrode 221 and an opposite electrode 223, thereby preventing the occurrence of an arc or the like at the edge of the pixel electrode 221. The pixel-defining layer 209 may be formed by a method such as spin coating, using an organic insulating material such as polyimide, polyamide, acryl resin, BCB, HMDSO, phenol resin, or the like. As another example, the pixel-defining layer 209 may include an inorganic insulating material. As another example, the pixel-defining layer 209 may have a multilayer structure including an inorganic insulating material and an organic insulating material. In some embodiments, the pixel-defining layer 209 may include a light blocking material and may be black. The light blocking material may include carbon black, carbon nanotubes, resin or paste including black pigments, metal particles, for example, nickel, aluminum, molybdenum, and an alloy thereof, metal oxide particles (e.g., chromium oxide), or metal nitride particles (e.g., chromium nitride). In case that the pixel-defining layer 209 includes a light blocking material, reflection of external light due to metal structures arranged below the pixel-defining layer 209 may be reduced.

A spacer 211 may be arranged on the pixel-defining layer 209. The spacer 211 may prevent layers arranged between the substrate 100 and the spacer 211 from being damaged by a mask used during a process of forming an emission layer (or light emission layer) 222b described below. The spacer 211 and the pixel-defining layer 209 may include a same material. In some embodiments, the spacer 211 may include a light blocking material.

A multi-layer 222 including a first common layer 222a, an emission layer 222b, and a second common layer 222c may be disposed on the spacer 211. The emission layer 222b may be arranged in the second opening 209OP of the pixel-defining layer 209. The emission layer 222b may include an organic material including a fluorescent or phosphorescent material capable of emitting red, green, or blue light. The organic material described above may be a low-molecular weight organic material or a high-molecular weight organic material.

The first common layer 222a and the second common layer 222c may be arranged under and on the emission layer 222b. The first common layer 222a may include, for example, a hole transport layer (HTL), or may include an HTL and a hole injection layer (HIL). The second common layer 222c may be an element arranged on the emission layer 222b and may include an electron transport layer (ETL) and/or an electron injection layer (EIL). The second common layer 222c is optional. In some embodiments, the second common layer 222c may not be provided.

While the emission layer 222b is arranged for each pixel to correspond to the second opening 209OP of the pixel-defining layer 209, each of the first common layer 222a and the second common layer 222c may be a common layer integrally formed (or integral therewith) to cover or overlap the entire substrate 100, for example, the entire display area of the substrate 100, as the opposite electrode 223 described below is.

The opposite electrode 223 may include a transparent layer or semi-transparent including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. As another example, the opposite electrode 223 may further include a layer, such as an ITO, IZO, ZnO, or $In_2O_3$ layer, on a transparent or semi-transparent layer including the above-described material. In an embodiment, the opposite electrode 223 may include silver (Ag), magnesium (Mg), or an alloy of silver (Ag) and magnesium (Mg).

The thin-film encapsulation layer 300 may include at least one inorganic encapsulation layer and at least one organic encapsulation layer. For example, as shown in FIG. 5A, the thin-film encapsulation layer 300 may include a first inorganic encapsulation layer 310, an organic encapsulation layer 320, and a second inorganic encapsulation layer 330.

The first inorganic encapsulation layer 310 and the second inorganic encapsulation layer 330 may include one or more inorganic insulating materials selected from among aluminum oxide, titanium oxide, tantalum oxide, hafnium oxide, zinc oxide, silicon oxide, silicon nitride, and silicon oxynitride. The first inorganic encapsulation layer 310 and the second inorganic encapsulation layer 330 may have a single-layer or multilayer structure including the inorganic insulating material described above.

The organic encapsulation layer 320 may relieve internal stress of the first inorganic encapsulation layer 310 and/or the second inorganic encapsulation layer 330.

The organic encapsulation layer 320 may include a polymer-based material. The polymer-based material may include polyethylene terephthalate, polyethylene naphthalate, polycarbonate, polyimide, polyethylene sulfonate, polyoxymethylene, polyarylate, HMDSO, acryl-based resin (e.g., poly(methyl methacrylate) (PMMA), poly(acrylic acid), or the like), or a combination thereof.

The organic encapsulation layer 320 may be formed by applying a monomer having flowability and curing a monomer layer by using heat or light such as ultraviolet rays. As another example, the organic encapsulation layer 320 may be formed by applying the polymer-based material described above.

The touch-sensing layer 400 may be arranged on the thin-film encapsulation layer 300. The touch-sensing layer 400 may include first and second sub-conductive layers CTL1 and CTL2 and a touch insulating layer 410. The touch-sensing layer 400 may further include a touch buffer layer 401.

The touch buffer layer 401 may be directly on the thin-film encapsulation layer 300. The touch buffer layer 401 may prevent damage to the thin-film encapsulation layer 300 and may block an interference signal that may occur in case that the touch-sensing layer 400 is driven. The touch buffer layer 401 may include an inorganic insulating material such as silicon oxide ($SiO_x$), silicon nitride ($SiN_x$), silicon oxynitride ($SiO_xN_y$), or the like or an organic material and may have a single-layer or multi-layer structure.

The first sub-conductive layer CTL1, the touch insulating layer 410, and the second sub-conductive layer CTL2 may be sequentially stacked on the touch buffer layer 401. The first sub-conductive layer CTL1 and the second sub-conductive layer CTL2 may be arranged under and on the touch insulating layer 410. In some embodiments, the second sub-conductive layer CTL2 may act as a sensor for sensing contact, and the first sub-conductive layer CTL1 may function as a connector for connecting the patterned second sub-conductive layer CTL2 in a direction. In an embodiment, the first sub-conductive layer CTL1 may act as a sensor for sensing contact, and the second sub-conductive layer CTL2 may function as a connector for connecting the patterned first sub-conductive layer CTL1 in a direction.

In some embodiments, both of the first sub-conductive layer CTL1 and the second sub-conductive layer CTL2 may act as a sensor. The first sub-conductive layer CTL1 and the second sub-conductive layer CTL2 may be electrically connected to each other through a contact hole 420ct formed in the touch insulating layer 410. As described above, as both of the first sub-conductive layer CTL1 and the second sub-conductive layer CTL2 are used as sensors, the resistance of a touch electrode may decrease, and thus, a response speed of the touch-sensing layer 400 may improve.

In some embodiments, the first sub-conductive layer CTL1 and the second sub-conductive layer CTL2 may have a mesh structure to allow light emitted from the organic light-emitting diode OLED to pass through. Accordingly, the first sub-conductive layer CTL1 and the second sub-conductive layer CTL2 may not overlap an emission area of the organic light-emitting diode OLED.

The first sub-conductive layer CTL1 and the second sub-conductive layer CTL2 may include a metal layer or a transparent conductive layer, and the metal layer may include molybdenum (Mo), silver (Ag), titanium (Ti), copper (Cu), aluminum (Al), or an alloy thereof. The transparent conductive layer may include transparent conductive oxide such as ITO, IZO, ZnO, indium tin zinc oxide (ITZO), or the like. The transparent conductive layer may include a conductive polymer such as poly(3,4-ethylenedioxythiophene) (PEDOT), metal nanowires, carbon nanotubes, graphene, or the like. In an embodiment, each of the first sub-conductive layer CTL1 and the second sub-conductive layer CTL2 may have a three-layer structure including a titanium layer, an aluminum layer, and a titanium layer.

The touch insulating layer 410 may include an inorganic material or an organic material. The inorganic material may be at least one of silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride. The organic material may be at least one of acryl-based resin, methacryl-based resin, polyisoprene, vinyl-based resin, epoxy-based resin, urethane-based resin, cellulose-based resin, and perylene-based resin.

The optical layer 500 may be arranged on the touch-sensing layer 400 and may include the first insulating layer 510 and the second insulating layer 530.

The first insulating layer 510 may be arranged on the second sub-conductive layer CTL2. The first insulating layer 510 may include the first opening 510OP overlapping the emission area EA. The refraction area LA may be defined by the first opening 510OP of the first insulating layer 510, and the emission area EA may be defined by the second opening 209OP of the pixel-defining layer 209. For example, a width of the second opening 209OP of the pixel-defining layer 209 may be a width (or first width) W1 of the emission area EA, and a width of the first opening 510OP of the first insulating layer 510 may be a width (or second width) W2 of the refraction area LA. In the description, the width W1 of the emission area EA may be defined based on a lower end of the second opening 209OP of the pixel-defining layer 209, and the width W2 of the refraction area LA may be defined based on a lower end of the first opening 510OP of the first insulating layer 510.

In some embodiments, the first opening 510OP of the first insulating layer 510 may overlap the second opening 209OP of the pixel-defining layer 209, and the second width W2 of the first opening 510OP of the first insulating layer 510 may be greater than the first width W1 of the second opening 209OP of the pixel-defining layer 209. For example, the second width W2 of the refraction area LA may be greater than the first width W1 of the emission area EA (where W2>W1).

A body portion of the first insulating layer 510 including the first opening 510OP may overlap a body portion of the pixel-defining layer 209. For example, the body portion of the first insulating layer 510 may overlap only the body portion of the pixel-defining layer 209. The body portion of the first insulating layer 510 may be a portion distinguished from the first opening 510OP of the first insulating layer 510 and refers to a portion having a volume. Likewise, the body portion of the pixel-defining layer 209 may be distinguished from the second opening 209OP of the pixel-defining layer 209 and refers to a portion having a volume.

The first insulating layer 510 may include photoresist. The first insulating layer 510 may be formed by applying photoresist entirely on the thin-film encapsulation layer 300 and then performing exposure and development thereon. By covering or overlapping a conductive layer included in the touch-sensing layer 400, for example, the first and second sub-conductive layers CTL1 and CTL2, the first insulating layer 510 may protect the conductive layer described above.

The second insulating layer 530 may be arranged on the first insulating layer 510 and may fill the first opening 510OP of the first insulating layer 510. For example, the second insulating layer 530 may fill the entire first opening 510OP of the first insulating layer 510. The second insulating layer 530 may include a substantially flat upper surface, and a thickness of a portion of the second insulating layer 530 overlapping the first opening 510OP may be greater than that of another portion (e.g., a portion overlapping an upper surface of the first insulating layer 510).

The second insulating layer 530 may directly contact a side surface 510S and the upper surface of the first insulating layer 510 defining the first opening 510OP. The second insulating layer 530 may directly contact the touch insulating layer 410 through the first opening 510OP.

The second insulating layer 530 may include a material having a higher refractive index than that of the first insulating layer 510, for example, an organic material having a high refractive index. As light L emitted from the organic light-emitting diode OLED and travelling in a direction oblique to a direction vertical to the upper surface of the substrate 100 (or direction z) may be totally reflected from the side surface 510S of the first insulating layer 510 and travel to the outside of the display apparatus, emission efficiency of the organic light-emitting diode OLED may improve, and luminance may increase.

A refractive index of the first insulating layer 510 may be about 1.3 to about 1.6. In some embodiments, a refractive index of the first insulating layer 510 may be about 1.4 to about 1.55. The first insulating layer 510 may include an acryl-based organic material having a refractive index of about 1.4 to about 1.55. The first insulating layer 510 may include acryl-based resin (e.g., PMMA, poly(acrylic acid), or the like), ethylhexyl acrylate, pentafluoropropyl acrylate, poly(ethylene glycol) dimethacrylate, or ethylene glycol dimethacrylate. In some embodiments, the first insulating layer 510 may further include a thermosetting agent such as epoxy and/or a photocuring agent.

A refractive index of the second insulating layer 530 may be about 1.65 to about 1.85. The second insulating layer 530 may include an acryl-based or siloxane-based organic material. In some embodiments, the second insulating layer 530 may include polydiarylsiloxane, methyltrimethoxysilane, or tetramethoxysilane. In some embodiments, the second insulating layer 530 may include dispersed particles for a high refractive index. For example, metal oxide particles such as zinc oxide ($ZnO_x$), titanium oxide ($TiO_2$), zirconium oxide ($ZrO_2$), barium titanate ($BaTiO_3$), or the like may be dispersed in the second insulating layer 530. The second insulating layer 530 may be formed by applying an organic material including metal oxide particles by using an inkjet.

The side surface 510S of the first insulating layer 510 may include an inclined surface. Inclination angles θ and θ' of the side surface 510S of the first insulating layer 510 may be at least about 70 degrees or greater. For example, the inclination angles θ and θ' may be about 70°≤θ<about 90°. As another example, the inclination angles θ and θ' may be about 70°≤θ≤ about 87°, about 70°≤θ, θ'≤ about 85°, about 70°≤θ, θ'≤ about 83°, or about 70°≤θ, θ' about 80°. The inclination angles θ and θ' may be measured as shown in an enlarged view of FIG. 5A. The inclination angle θ may be measured as an angle between a line VL vertical to an upper surface of the thin-film encapsulation layer 300 (e.g., an upper surface of the second inorganic encapsulation layer 330) at an end of the first opening 510OP and a line GL meeting the side surface 510S of the first insulating layer 510 at the end of the first opening 510OP. The inclination angle θ' may be measured as an angle formed by a line connecting a point h1 of the side surface 510S at about 10% of a thickness of the first insulating layer 510 and a point h2 of the side surface 510S at about 90% of the thickness to each other with the upper surface of the thin-film encapsulation layer 300.

The side surface 510S of the first insulating layer 510 may include an inclined surface tapered in a forward direction with respect to the upper surface of the thin-film encapsulation layer 300, and thus, the width of the first opening 510OP may gradually increase as a distance from the substrate 100 increases in the direction vertical to the upper surface of the substrate 100 (or direction z). A width of an upper portion of the first opening 510OP may be greater than that of a lower portion thereof, and the second width W2 of the first opening 510OP described above may correspond to the width of the lower portion thereof. The width W1 of the pixel-defining layer 209 may also correspond to a width of a lower portion of the pixel-defining layer 209.

Although it has been described with reference to FIG. 5A that the conductive layer included in the touch-sensing layer 400 has a dual structure of the first and second sub-conductive layers CTL1 and CTL2, the disclosure is not limited thereto. The touch-sensing layer 400 may include a single-body conductive layer arranged under or on the touch insulating layer 410.

Figure 5B:
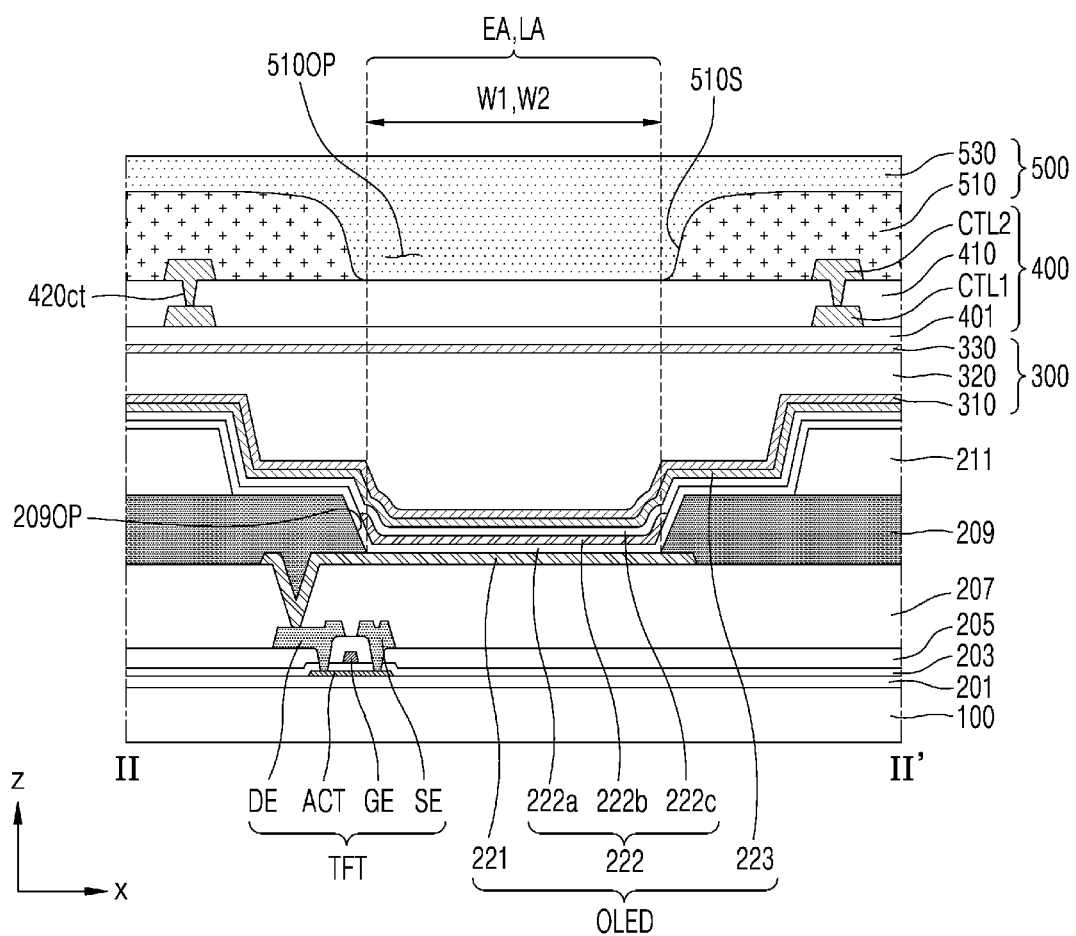
FIG. 5B is a schematic cross-sectional view of a display apparatus according to an embodiment.
Figure 5C:
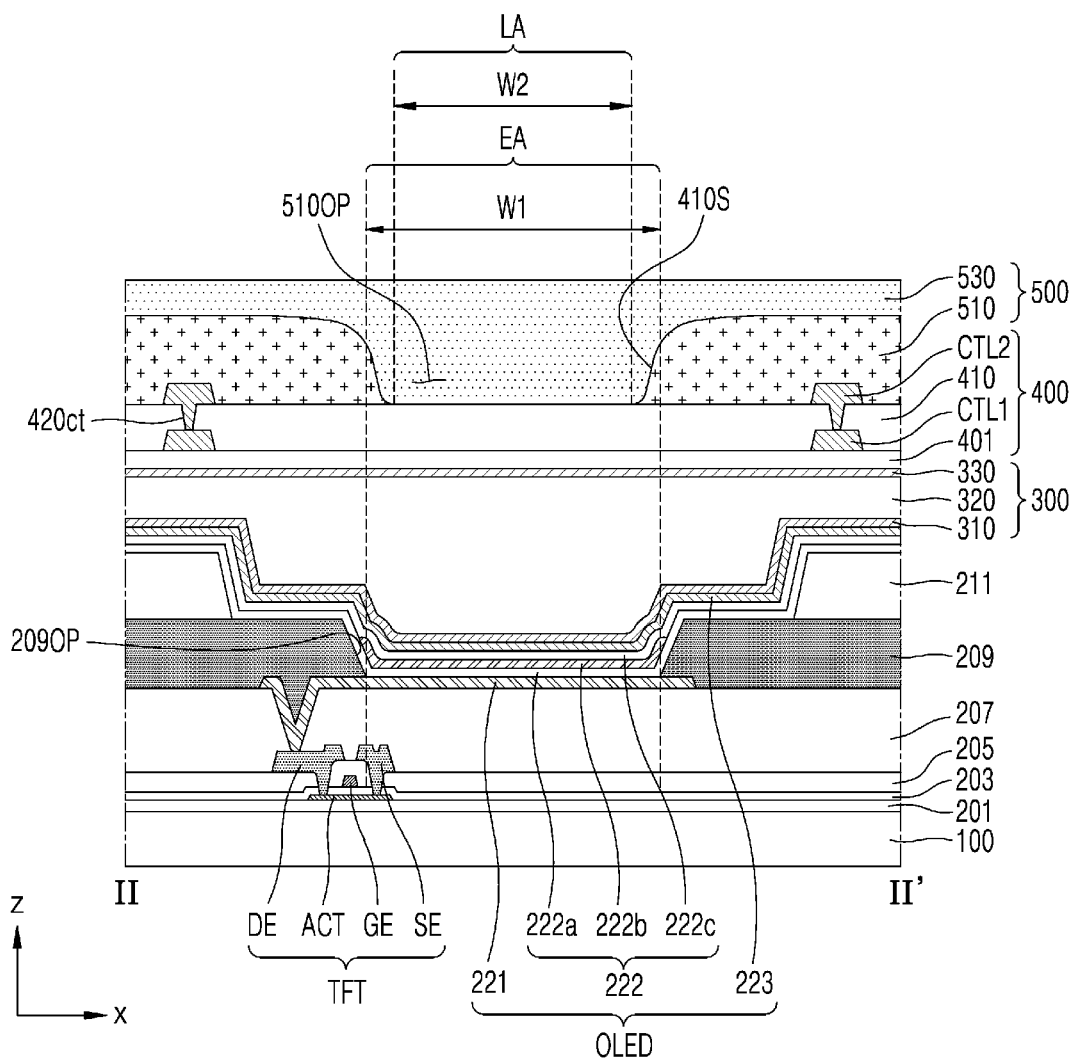
FIG. 5C is a schematic cross-sectional view of a display apparatus according to an embodiment.
Figure 5D:
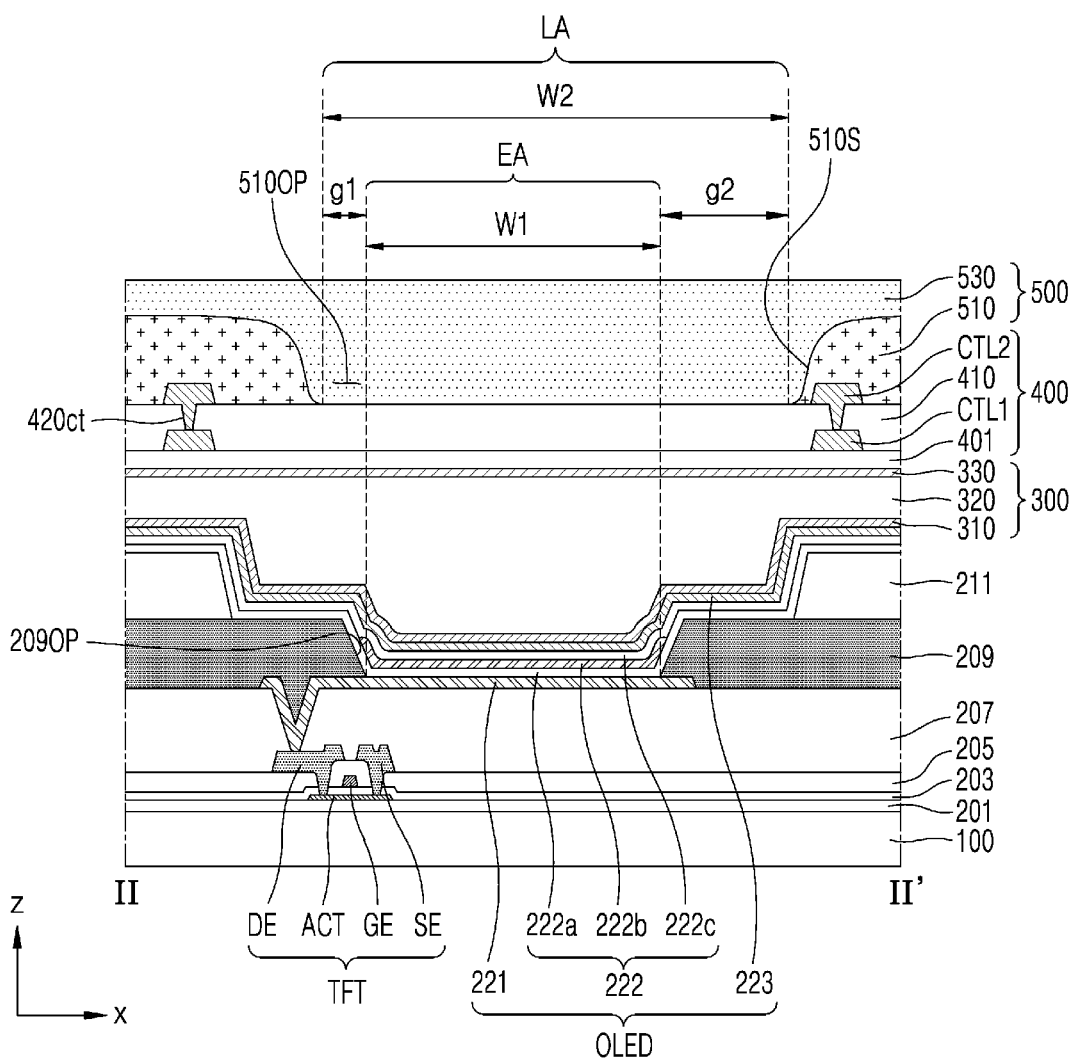
FIG. 5D is a schematic cross-sectional view of a display apparatus according to an embodiment.

FIGS. 5B to 5D are schematic cross-sectional views of a portion of a display apparatus according to embodiments. In FIGS. 5B to 5D, reference numerals that are identical to those in FIG. 5A denote the same elements, and thus, redundant descriptions thereof are omitted.

Although it has been described with reference to FIG. 5A that the second width W2 of the refraction area LA is greater than the first width W1 of the emission area EA, the disclosure is not limited thereto. As shown in FIG. 5B, the first width W1 of at least one emission area EA of the display apparatus may be substantially equal to the second width W2 of the refraction area LA (i.e., W1=W2). As another example, as shown in FIG. 5C, the first width W1 of at least one emission area EA of the display apparatus may be greater than the second width W2 of the refraction area LA (i.e., W1 >W2).

Although FIG. 5A illustrates that a center point of the refraction area LA is substantially aligned with that of the emission area EA, the disclosure is not limited thereto. As shown in FIG. 5D, a center point of the refraction area LA may not be aligned with that of the emission area EA. For example, a first distance g1 between an end of the refraction area LA and an end of the emission area EA at one side may not be equal to a second distance g2 between an end of the refraction area LA and an end of the emission area EA at the other side.

Figure 6:
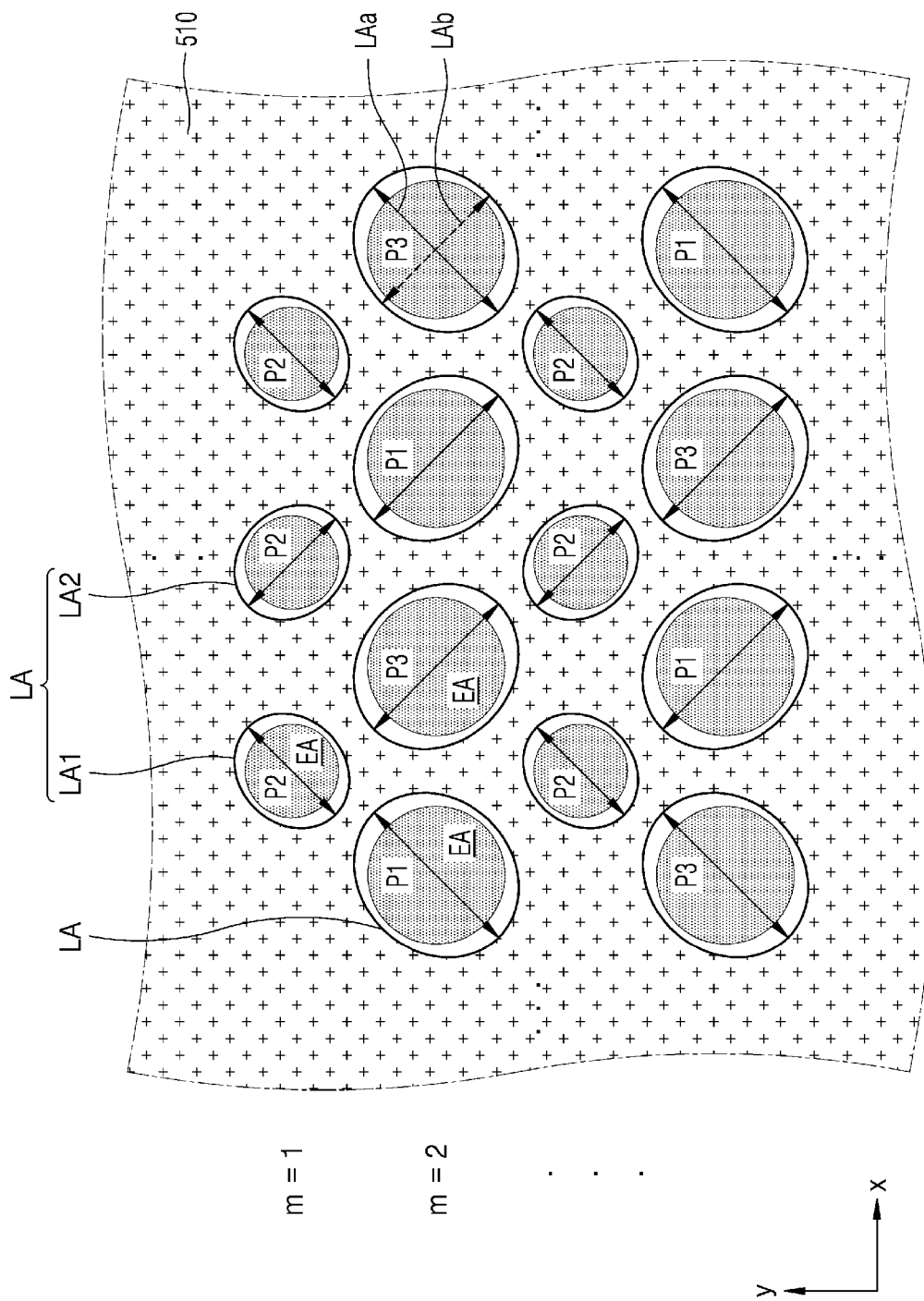
FIG. 6 is a schematic plan layout diagram of a display apparatus according to an embodiment.

FIG. 6 is a schematic plan layout diagram of a display apparatus according to an embodiment. In FIG. 6, reference numerals that are identical to those in FIG. 4A denote the same elements.

Referring to FIG. 6, the refraction area LA may have an elliptical shape in a plan view. For example, the refraction area LA may have a long axis LAa and a short axis LAb shorter than the long axis LAa. The refraction area LA may correspond to the emission area EA of each of the first to third pixels P1, P2, and P3. In some embodiments, a center point of the refraction area LA may be substantially aligned with that of the emission area EA. In an embodiment, a center point of the refraction area LA may not be aligned with that of the emission area EA.

The refraction area LA may include a first refraction area LA1 and a second refraction area LA2 adjacent to each other in direction x. In the embodiment, at least one of a size relative to the emission area EA, a shape, and an arrangement of the first refraction area LA1 may be different from that of the second refraction area LA2.

Referring to FIG. 6, the first refraction area LA1 and the second refraction area LA2 adjacent to each other in a first row (m=1) may be different from each other in a direction of the long axis LAa.

The long axis LAa of the first refraction area LA1 may be provided right-upwards with respect to direction x, and the long axis LAa of the second refraction area LA2 may be provided left-upwards with respect to direction x. For example, the long axis LAa of the first refraction area LA1 may be arranged approximately in a direction $(+)\varphi$ with respect to direction x, and the long axis LAa of the second refraction area LA2 may be arranged approximately in a direction $(-)\varphi$ with respect to direction x. In this regard, $\varphi$ may be an angle formed by the long axis LAa and direction x and may be an acute angle. As described above, refraction areas LA arranged in the same row, for example, the first row (m=1), may be alternately arranged so that angles of long axes are $(+)\varphi$ and $(-)\varphi$ in direction x.

In some embodiments, lengths of the long axis LAa of the first refraction area LA1 and the long axis LAa of the second refraction area LA2 may be different from each other. Accordingly, shapes of the first refraction area LA1 and the second refraction area LA2 may be different from each other.

As another example, similar to the refraction areas LA arranged in a second row (m=2), the refraction areas LA may be arranged such that angles of long axes are $(+)\varphi$, $(-)\varphi$, $(-)\varphi$, and $(+)\varphi$ in direction x.

In some embodiments, sizes of the refraction areas LA may be modified in connection with the emission area EA. For example, in case that a size of the emission area EA of the first pixel P1 is greater than that of the emission area EA of the second pixel P2, a size of the refraction area LA corresponding to the first pixel P1 may be greater than that of the refraction area LA corresponding to the second pixel P2.

In some embodiments, lengths of the long axis LAa and the short axis LAb of the refraction area LA may be greater than a diameter of the corresponding emission area EA. However, the disclosure is not limited thereto. At least one of lengths of the long axis LAa and the short axis LAb of the refraction area LA may be equal to or less than a diameter of the corresponding emission area EA.

In case that the refraction areas LA have the same shape, arrangement, and size with respect to all of the emission areas EA, there may be an area where the refraction area LA and the emission area EA are not aligned with each other because of an error caused by processes. In case that such a process error occurs, a reflection diffraction phenomenon due to external light may be intensified in a certain direction.

In the embodiment, diffraction dispersion due to process errors may be reduced by differently forming at least one of shapes, arrangement, and sizes of the refraction areas LA according to (or depending on) locations.

Although FIG. 6 illustrates the emission area EA having a circular shape, the disclosure is not limited thereto. As described with reference to FIG. 4B, the emission area EA may have a polygonal shape with eight or more sides.

Figure 7:
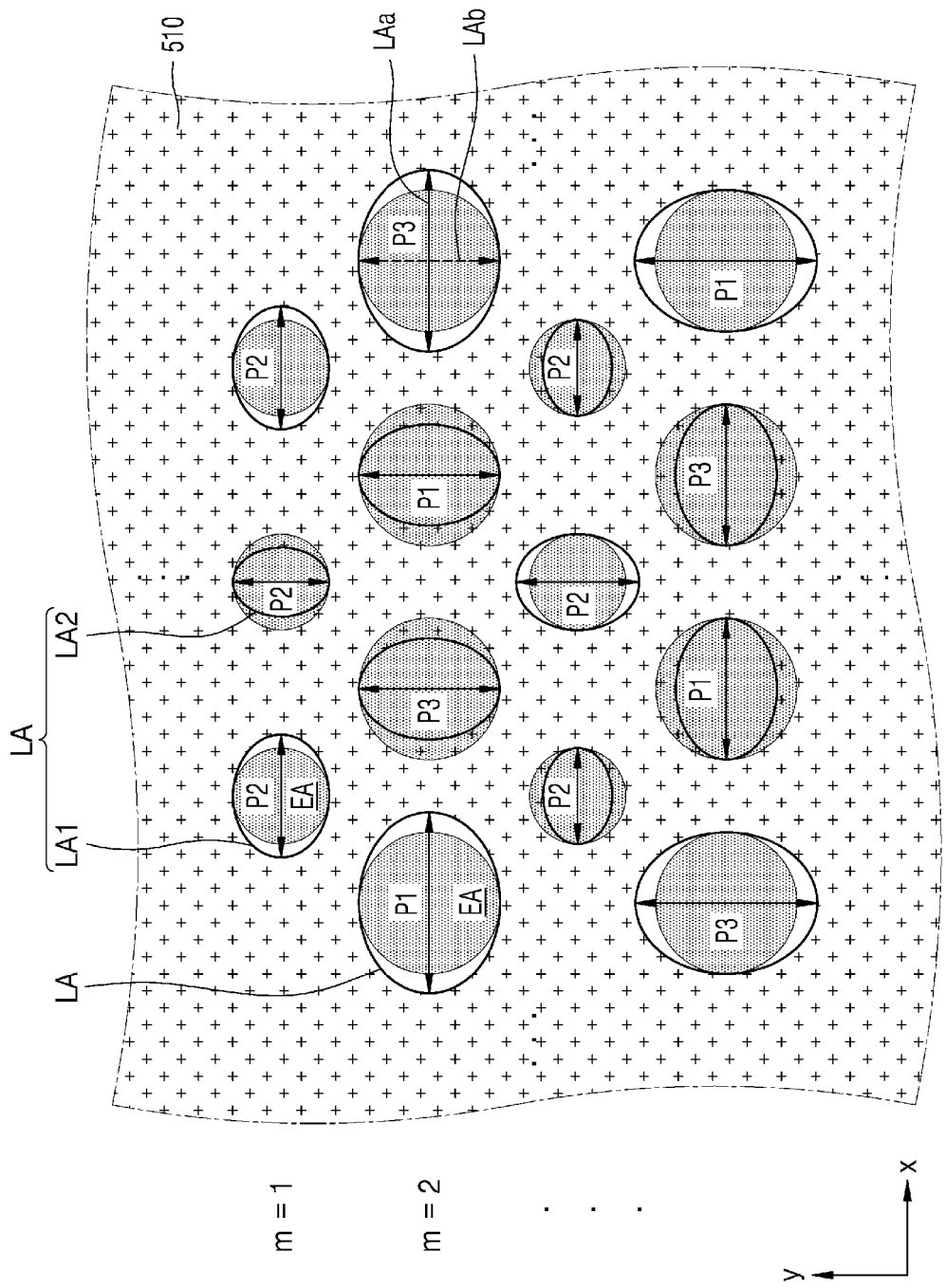
FIG. 7 is a schematic plan layout diagram of a display apparatus according to an embodiment.

FIG. 7 is a schematic plan layout diagram of a display apparatus according to an embodiment. In FIG. 7, reference numerals that are identical to those in FIG. 6 denote the same elements.

Referring to FIG. 7, the first refraction area LA1 and the second refraction area LA2 adjacent to each other in a first row (m=1) may be different from each other in a direction of the long axis LAa.

The long axis LAa of the first refraction area LA1 may be provided in direction x, and the long axis LAa of the second refraction area LA2 may be provided in direction y. As described above, the refraction areas LA arranged in the same row, for example, the first row (m=1), may be alternately arranged so that long axes are arranged in direction x, direction y, and direction x. Similar to the refraction areas LA arranged in a second row (m=2), the refraction areas LA may be arranged such that directions of long axes are direction x, direction y, direction y, and direction x.

Sizes of the first refraction area LA1 and the second refraction area LA2 may be different from each other and/or from the corresponding emission areas EA, respectively. For example, an area of the first refraction area LA1 may be greater than that of the corresponding emission area EA, and an area of the second refraction area LA2 may be less than that of the corresponding emission area EA.

Referring to FIG. 7, in the first refraction area LA1, a length of the short axis LAb may be substantially equal to a diameter of the corresponding emission area EA, and in the second refraction area LA2, a length of the long axis LAa may be substantially equal to a diameter of the corresponding emission area EA, and thus, a relative size between the refraction area LA and the emission area EA may be different according to each location.

When a relative area (RA) is defined as RA=(area of refraction area)/(area of emission area), the relative area (RA) in the first row (m=1) may be RA>1, RA<1, RA>1, . . . in direction x. In the second row (m=2), the relative area (RA) may be RA>1, RA<1, RA<1, RA>1, . . . in direction x.

In the embodiment, diffraction dispersion due to process errors may be reduced by differently forming at least one of sizes relative to emission areas, shapes, and arrangements of the refraction areas LA according to each location.

Although FIG. 7 illustrates the emission area EA having a circular shape, the disclosure is not limited thereto. As described with reference to FIG. 4B, the emission area EA may have a polygonal shape with eight or more sides.

Figure 8:
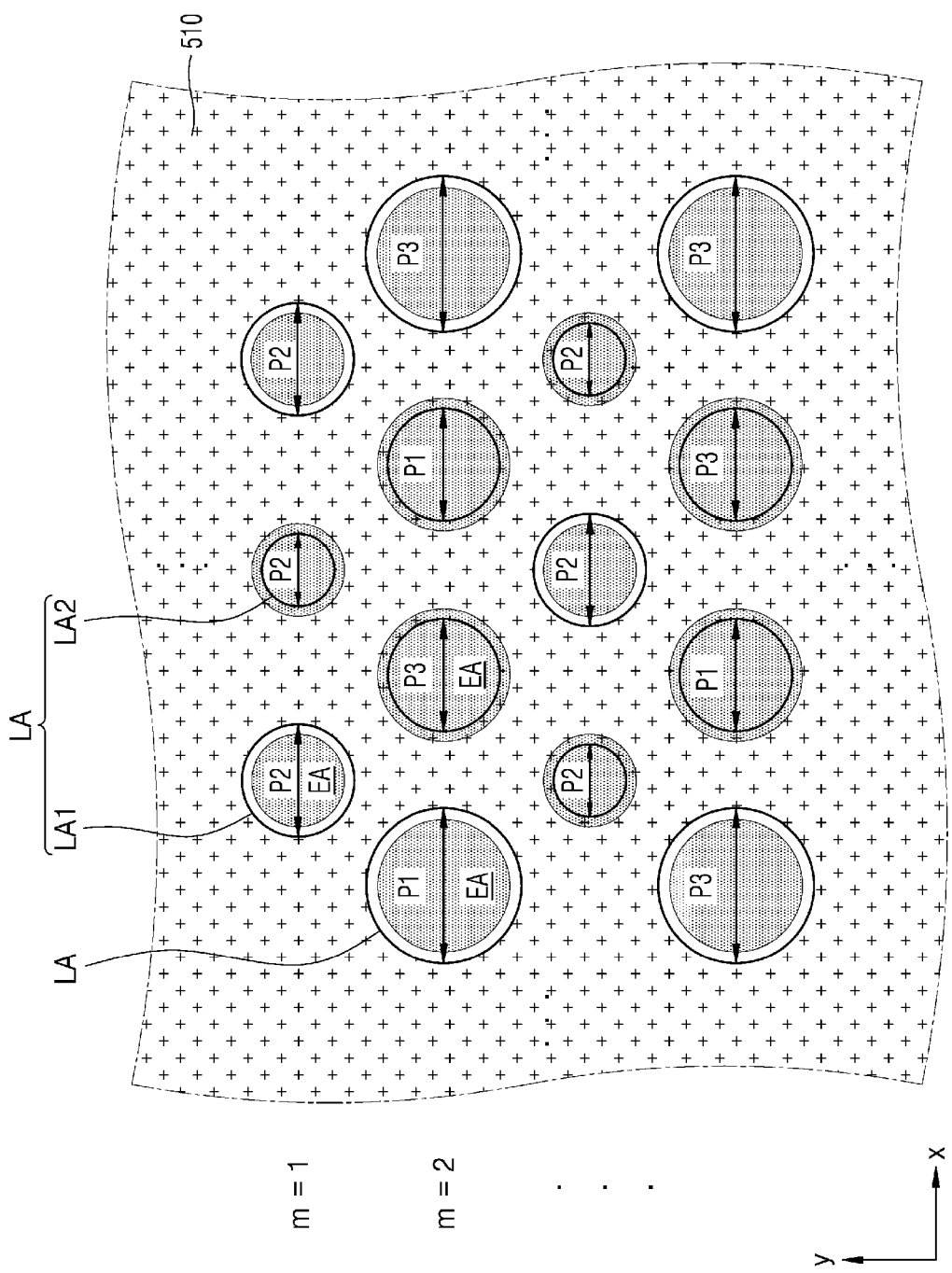
FIG. 8 is a schematic plan layout diagram of a display apparatus according to an embodiment.

FIG. 8 is a schematic plan layout diagram of a display apparatus according to an embodiment. In FIG. 8, reference numerals that are the same as those in FIG. 6 denote the same elements.

Referring to FIG. 8, the refraction area LA may have a circular shape or a polygonal shape with eight or more sides in a plan view. The refraction area LA may correspond to the emission area EA of each of the first to third pixels P1, P2, and P3. In some embodiments, a center point of the refraction area LA may be substantially aligned with that of the emission area EA. In an embodiment, a center point of the refraction area LA may not be aligned with that of the emission area EA.

The refraction area LA may include the first refraction area LA1 and the second refraction area LA2 adjacent to each other in direction x. In the embodiment, at least one of a relative size to the emission area EA, a shape, and an arrangement of the first refraction area LA1 may be different from that of the second refraction area LA2.

Referring to FIG. 8, sizes of the first refraction area LA1 and the second refraction area LA2 may be different from each other and/or from the corresponding emission areas EA, respectively. For example, an area of the first refraction area LA1 may be greater than that of the corresponding emission area EA, and an area of the second refraction area LA2 may be less than that of the corresponding emission area EA.

In the first refraction area LA1, a length of a diameter of the first refraction area LA1 may be greater than a diameter of the corresponding emission area EA, and in the second refraction area LA2, a length of a diameter of the second refraction area LA2 may be less than a diameter of the corresponding emission area EA.

When a relative area (RA) is defined as RA=(area of refraction area)/(area of emission area), the relative area (RA) in a first row (m=1) may be RA>1, RA<1, RA>1, ... in direction x. In a second row (m=2), the relative area (RA) may be RA>1, RA <1, RA<1, RA>1, ... in direction x.

In the embodiment, diffraction dispersion due to process errors may be reduced by differently forming at least one of relative sizes to emission areas, shapes, and arrangements of the refraction areas LA according to (or depending on) locations.

Although FIG. 8 illustrates the emission area EA and the refraction area LA having a circular shape, the disclosure is not limited thereto. As described with reference to FIG. 4B, the emission area EA and the refraction area LA may have a polygonal shape with eight or more sides.

Figure 9:
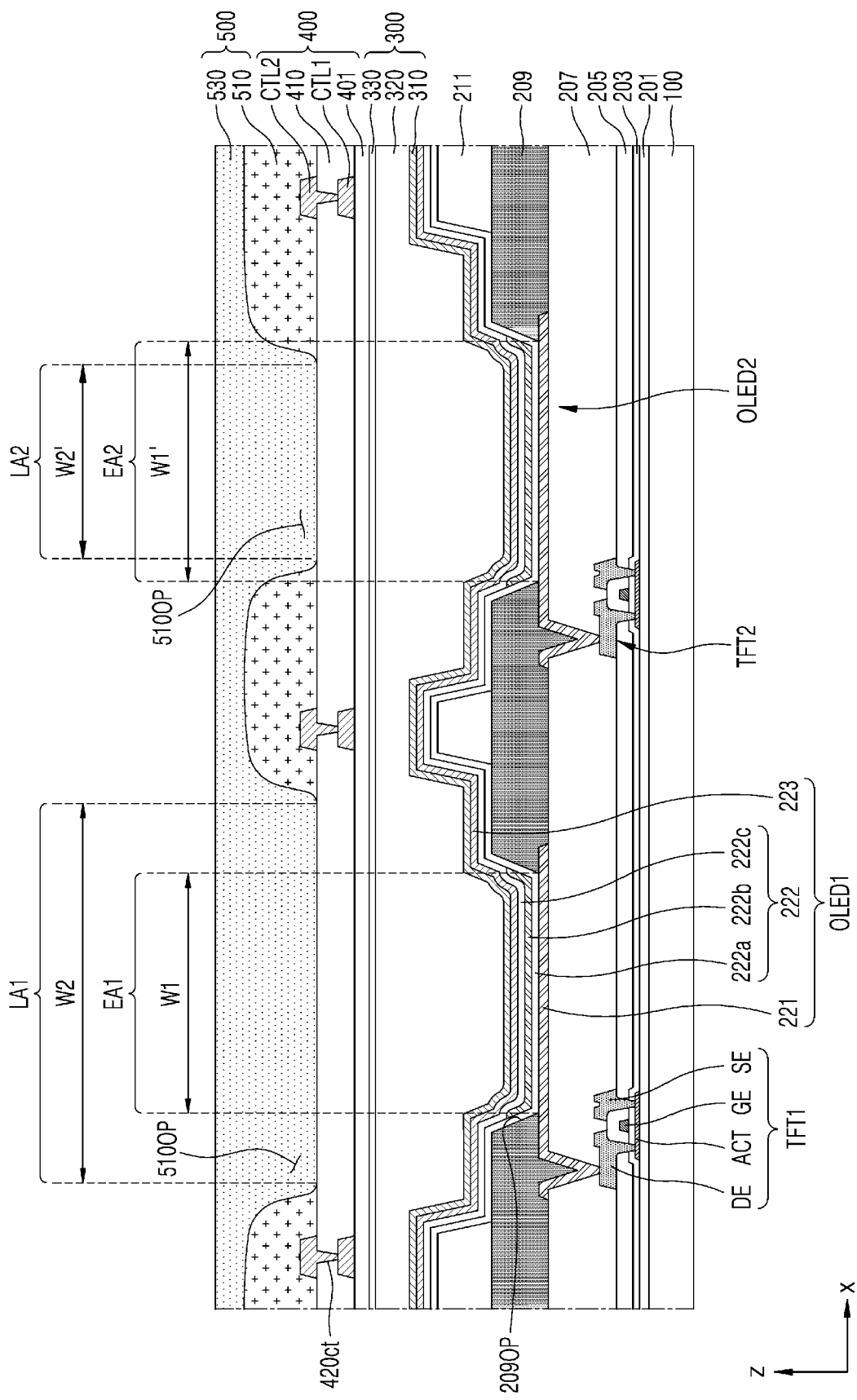
FIG. 9 is a schematic cross-sectional view of a display apparatus according to an embodiment.

FIG. 9 is a schematic cross-sectional view of a display apparatus according to an embodiment. In FIG. 9, reference numerals that are the same as those in FIG. 5A denote the same elements, and thus, redundant descriptions thereof are omitted.

Referring to FIG. 9, a display apparatus according to an embodiment may include a first organic light-emitting diode OLED1 including a first emission area EA1 over the substrate 100, a second organic light-emitting diode OLED2 including a second emission area EA2, the thin-film encapsulation layer 300, the first insulating layer 510 including the first refraction area LA1 and the second refraction area LA2, and the second insulating layer 530 filling the first refraction area LA1 and the second refraction area LA2. The first organic light-emitting diode OLED1 may be driven by a first thin-film transistor TFT1, and the second organic light-emitting diode OLED2 may be driven by a second thin-film transistor TFT2.

The first emission area EA1 and the second emission area EA2 may be defined by the second opening 209OP of the pixel-defining layer 209, and the first refraction area LA1 and the second refraction area LA2 may be defined by the first opening 510OP of the first insulating layer 510.

The first refraction area LA1 may correspond to the first emission area EA1, and the second refraction area LA2 may correspond to the second emission area EA2. Although FIG. 9 illustrates that a center of the first refraction area LA1 and a center of the first emission area EA1 are aligned with each other and a center of the second refraction area LA2 and a center of the second emission area EA2 are aligned with each other, the disclosure is not limited thereto. Centers of the first and second refraction areas LA1 and LA2 and centers of the first and second emission areas EA1 and EA2 may not be aligned with each other.

In the embodiment, the width W2 of the first refraction area LA1 may be greater than the width W1 of the first emission area EA1. A width W2' of the second refraction area LA2 may be less than a width W1' of the second emission area EA2.

For example, a relative size to the corresponding emission area may be greater than 1 in the first refraction area LA1 and may be less than 1 in the second refraction area LA2.

In the embodiment, diffraction dispersion due to process error may be reduced by differently forming at least one of relative sizes to emission areas, shapes, and arrangements of the refraction areas LA according to (or depending on) locations.

Figure 10:
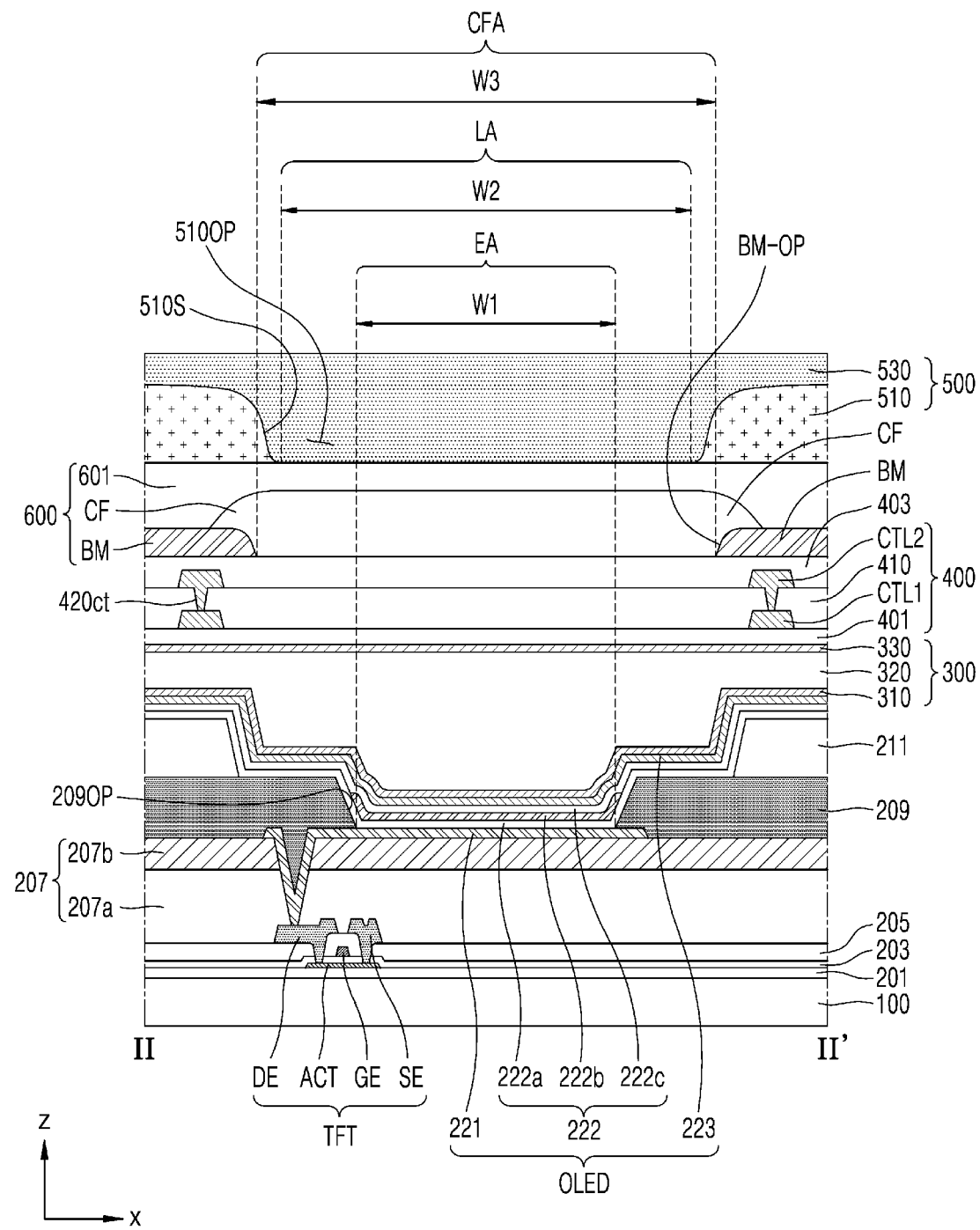
FIG. 10 is a schematic cross-sectional view of a display apparatus according to an embodiment.

FIG. 10 is a schematic cross-sectional view of a display apparatus according to an embodiment. In FIG. 10, reference numerals that are identical to those in FIG. 5A denote the same elements.

Referring to FIG. 10, the display apparatus may include the planarization insulating layer 207 provided as multiple layers. The display apparatus may further include an anti-reflection layer 600.

The planarization insulating layer 207 may include a first planarization insulating layer 207a and a second planarization insulating layer 207b on the first planarization insulating layer 207a. As the planarization insulating layer 207 includes a plurality of layers, the flatness of an upper surface of the planarization insulating layer 207 may improve. Accordingly, as the pixel electrode 221 arranged on the planarization insulating layer 207 may be flat, diffused reflection due to the pixel electrode 221 may be reduced.

The first planarization insulating layer 207a may include a general commercial polymer such as BCB, photosensitive polyimide, polyimide, HMDSO, PMMA, or polystyrene (PS), a polymer derivative having a phenol-based group, an acryl-based polymer, an imide-based polymer, an aryl ether-based polymer, an amide-based polymer, a fluorine-based polymer, a p-xylene-based polymer, or a vinyl alcohol-based polymer.

The second planarization insulating layer 207b may include a siloxane-based organic material having high flatness. The siloxane-based organic material may include HMDSO, octamethyltrisiloxane, decamethyltetrasiloxane, dodecamethylpentasiloxane, and polydimethylsiloxane.

As another example, the second planarization insulating layer 207b may include a general commercial polymer such as BCB, photosensitive polyimide, polyimide, HMDSO, PMMA, or PS, a polymer derivative having a phenol-based group, an acryl-based polymer, an imide-based polymer, an aryl ether-based polymer, an amide-based polymer, a fluorine-based polymer, a p-xylene-based polymer, or a vinyl alcohol-based polymer. The second planarization insulating layer 207b and the first planarization insulating layer 207a may include a different material or the same material.

The anti-reflection layer 600 may be arranged between the touch-sensing layer 400 and the optical layer 500. The touch-sensing layer 400 may further include a touch protection layer 403. The touch protection layer 403 may be provided over the entire surface of the substrate 100 to cover or overlap the second sub-conductive layer CTL2 and may protect the second sub-conductive layer CTL2. The touch protection layer 403 may include an inorganic material or an organic material. The anti-reflection layer 600 may include a color filter CF overlapping the emission area EA and a black matrix BM overlapping a non-emission area. The anti-reflection layer 600 may further include a protective layer 601 on the color filter CF and the black matrix BM. The protective layer 601 may include an organic material and may provide a flat upper surface.

The color filter CF may be arranged by taking into account a color of light emitted from the organic light-emitting diode OLED. For example, the anti-reflection layer 600 may include a red, green, or blue color filter. A color filter area CFA where the color filter CF is arranged may be defined by an opening BM-OP of the black matrix BM. To form the anti-reflection layer 600, a red, green, or blue color filter CF may be filled in the opening BM-OP of the black matrix BM including black resin such as carbon black. The color filter CF may be filled in the opening BM-OP of the black matrix BM, and a portion thereof may extend to an upper surface of the black matrix BM.

The color filter CF may overlap the emission area EA and the refraction area LA. In some embodiments, a center of the color filter CF may be substantially aligned with that of the emission area EA. However, the disclosure is not limited thereto. A center of the color filter CF may not be aligned with that of the emission area EA.

In some embodiments, a third width W3 of the color filter area CFA may be greater than the first width W1 of the emission area EA. Accordingly, an area of the color filter area CFA may be greater than that of the emission area EA. In the description, the third width W3 of the color filter area CFA may be defined based on a lower end of the opening BM-OP of the black matrix BM.

In some embodiments, the third width W3 of the color filter area CFA may be greater than the second width W2 of the refraction area LA. However, the disclosure is not limited thereto. The third width W3 of the color filter area CFA may be equal to or less than the second width W2 of the refraction area LA.

Figure 11:
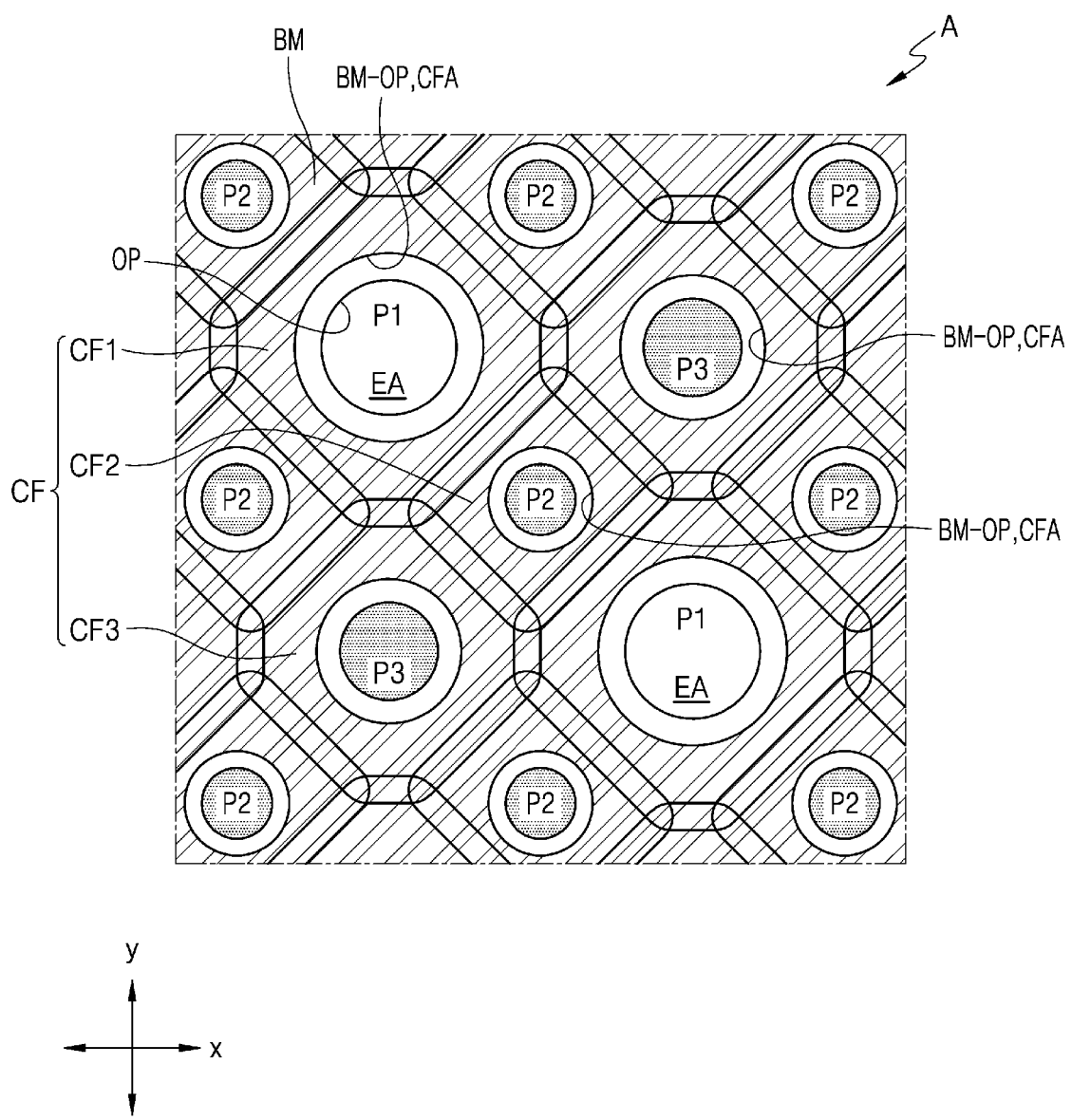
FIG. 11 is a schematic enlarged plan view of some elements that may be included in area A of FIG. 1 according to an embodiment.

FIG. 11 is a schematic enlarged plan view of some elements that may be included in area A of FIG. 1 according to an embodiment and illustrates pixels and the color filter CF corresponding to the emission area EA of each pixel. In FIG. 11, reference numerals that are identical to those in FIG. 4A denote the same elements.

Referring to FIG. 11, a display apparatus may include pixels, and the pixels may include the first pixel P1, the second pixel P2, and the third pixel P3 emitting different colors from one another. For example, the first pixel P1 may emit blue light, the second pixel P2 may emit green light, and the third pixel P3 may emit red light. However, the disclosure is not limited thereto. Various modifications may be made, and for example, the first pixel P1 may emit red light, the second pixel P2 may emit green light, and the third pixel P3 may emit blue light.

In the embodiment, the color filter CF corresponding to a color of each pixel may correspond to the emission areas EA of the first pixel P1, the second pixel P2, and the third pixel P3. The color filter CF may fill the opening BM-OP of the black matrix BM and may extend to an upper surface of the black matrix BM. For example, the color filter CF may partially overlap a body of the black matrix BM, and thus, an area of the color filter CF itself may be greater than that of the color filter area CFA emitting color. In the description, the color filter area CFA may be defined as the opening BM-OP of the black matrix BM.

The color filter CF may have a shape of a rhombus with rounded corners or a polygon in a plan view. The color filter CF may include a first color filter CF1 corresponding to the first pixel P1, a second color filter CF2 corresponding to the second pixel P2, and a third color filter CF3 corresponding to the third pixel P3. The first color filter CF1, the second color filter CF2, and the third color filter CF3 may each display the color identical to a color of the corresponding pixel. The first color filter CF1, the second color filter CF2, and the third color filter CF3 may overlap one another at the edges. Sizes of the first color filter CF1, the second color filter CF2, and the third color filter CF3 may depend on a size of the emission area EA of each pixel.

The emission areas EA of the first pixel P1, the second pixel P2, and the third pixel P3 may have a circular shape or a polygonal shape with eight or more sides. For example, the emission areas EA of the first pixel P1, the second pixel P2, and the third pixel P3 may have a shape close to a circular shape.

Likewise, the opening BM-OP of the black matrix BM, for example, the color filter area CFA, may have a circular shape or a polygonal shape with eight or more sides. As the emission area EA and the color filter area CFA have a circular shape or a polygonal shape with eight or more sides close to a circular shape, the diffraction due to reflection of external light in a certain direction may be reduced.

An area of the color filter area CFA may be greater than that of the emission area EA. A perimeter of the color filter area CFA may surround that of the emission area EA. Accordingly, lateral visibility of the display apparatus may improve.

A size of the color filter area CFA may depend on that of the emission area EA of each pixel. However, the disclosure is not limited thereto. Various modifications may be made, and for example, sizes of color filter areas CFA arranged in the first pixel P1, the second pixel P2, and the third pixel P3 may be substantially the same as one another.

Figure 12A:
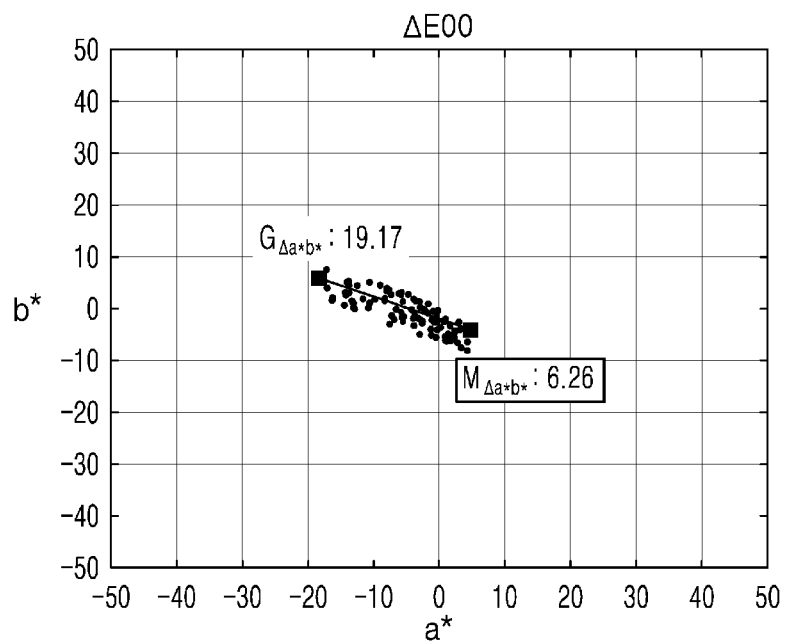
FIGS. 12A and 12B show data of color deviation according to shapes of an emission area and a color filter area.
Figure 12B:
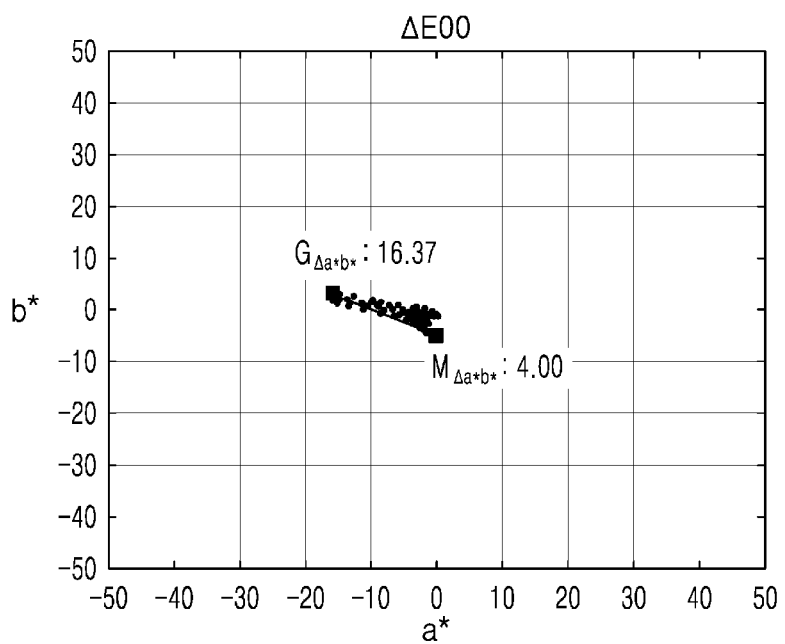

FIGS. 12A and 12B illustrate data of color deviation according to shapes of an emission area and a color filter area. FIG. 12A illustrates data of color deviation for white light in case that the emission area and the color filter area have a rhombus shape, and FIG. 12B illustrates data of color deviation for white light in case that the emission area and the color filter area have a circular shape.

Referring to FIG. 12A, in case that the emission area and the color filter area have a rhombic shape, it was measured that there was a color difference of about 19.17 for green (G$\Delta a^*b^*$) and about 6.26 for magenta (M$\Delta a^*b^*$), and a maximum color difference $\Delta E00$ was measured to be about 18.3.

Referring to FIG. 12B, in case that the emission area and the color filter area have a circular shape, it was measured that there was a color difference of about 16.37 for green (G$\Delta a^*b^*$) and about 4.00 for magenta (M$\Delta a^*b^*$), and the maximum color difference $\Delta E00$ was about 11.3.

As described above, it may be seen that in case that the emission area and the color filter area have a circular shape, the maximum color difference is improved by about 38%.

One or more embodiments include a display apparatus in which light efficiency may be improved to provide a high-quality image. However, such a technical problem is an example, and the disclosure is not limited thereto.

It should be understood that embodiments described herein should be considered in a descriptive sense only and not for purposes of limitation. Descriptions of features or aspects within each embodiment should typically be considered as available for other similar features or aspects in other embodiments. While some embodiments have been described with reference to the figures, it will be understood by those of ordinary skill in the art that various changes in form and details may be made therein without departing from the spirit and scope of the disclosure.

What is claimed is:

1. A display apparatus comprising:
    a display element disposed on a substrate and comprising an emission area;
    a thin-film encapsulation layer disposed on the display element, the thin-film encapsulation layer comprising:
        at least one inorganic encapsulation layer; and
        at least one organic encapsulation layer;
    a first insulating layer disposed on the thin-film encapsulation layer, the first insulating layer comprising:
        an opening that corresponds to the emission area; and
        a refraction area defined by the opening and comprising an organic material; and
    a second insulating layer disposed on the first insulating layer, filling the refraction area, and having a refractive index greater than a refractive index of the first insulating layer, wherein
    the display element comprises a first display element and a second display element,
    the refraction area has a circular shape, a polygonal shape having eight or more sides, or an elliptical shape in a plan view,
    the refraction area comprising:
        a first refraction area corresponding to the first display element; and
        a second refraction area corresponding to the second display element,
    the first refraction area and the second refraction area are different in at least one of a relative size to a corresponding emission area, a shape, and an arrangement,
    a first emission area overlaps the first refraction area and the first display element in a plan view and
    a first distance in a plan view between an end of the first refraction area and an end of the first emission area corresponding to a first side of the first emission area is different from a second distance in a plan view between an end of the first refraction area and an end of the first emission area corresponding to second and different side of the first emission area.

2. The display apparatus of claim 1, wherein the emission area has a circular shape or a polygonal shape having eight or more sides in a plan view.

3. The display apparatus of claim 1, wherein the first refraction area and the second refraction area are alternately disposed in a direction.

4. The display apparatus of claim 1, further comprising an anti-reflection layer disposed between the display element and each of the first insulating layer and the second insulating layer, the anti-reflection layer comprising:
    a color filter overlapping the emission area; and
    a black matrix overlapping a non-emission area outside the emission area,
    wherein a width of an area where the color filter is disposed is greater than a width of the emission area.

5. The display apparatus of claim 4, wherein
    the color filter is disposed in an opening of the black matrix and on the black matrix, and
    the opening of the black matrix has a circular shape or a polygonal shape having eight or more sides in a plan view.

6. The display apparatus of claim 1, further comprising a touch-sensing layer disposed between the thin-film encapsulation layer and the second insulating layer, the touch-sensing layer comprising a conductive layer.

7. The display apparatus of claim 1, wherein the first insulating layer comprises an inclined surface that surrounds at least a portion of the opening of the first insulating layer, the inclined surface having an inclination angle of at least 70 degrees.

8. The display apparatus of claim 1, wherein a center of the first refraction area is not aligned with a center of an emission area of the first display element.

9. The display apparatus of claim 1, wherein
    a first emission area corresponds to the first refraction area and the first display element, and
    a first distance between an end of the first refraction area and an end of the first emission area corresponding to a first side of the first emission area is different from a second distance between an end of the first refraction area and an end of the first emission area corresponding to second and different side of the first emission area.

10. The display apparatus of claim 1, wherein
    the emission area being an opening in a pixel defining layer in the display element,
    the opening in the first insulating layer overlaps the opening in the pixel defining layer in a plan view.

11. A display apparatus comprising:
    a display element disposed on a substrate and comprising an emission area;
    a thin-film encapsulation layer disposed on the display element, the thin-film encapsulation layer comprising:
        at least one inorganic encapsulation layer; and
        at least one organic encapsulation layer;
    a first insulating layer disposed on the thin-film encapsulation layer, the first insulating layer comprising:
        an opening that corresponds to the emission area; and
        a refraction area defined by the opening and comprising an organic material; and
    a second insulating layer disposed on the first insulating layer, filling the refraction area, and having a refractive index greater than a refractive index of the first insulating layer, wherein
    the display element comprises a first display element and a second display element,
    the refraction area has a circular shape, a polygonal shape having eight or more sides, or an elliptical shape in a plan view, the refraction area comprising:
        a first refraction area corresponding to the first display element; and
        a second refraction area corresponding to the second display element,
    the first refraction area and the second refraction area are different in at least one of a relative size to a corresponding emission area, a shape, and an arrangement,
    the first refraction area and the second refraction area have an elliptical shape in a plan view, and a direction of a long axis of the first refraction area and a direction of a long axis of the second refraction area are different from each other.

12. The display apparatus of claim 11, wherein
a relative area of the first refraction area to an emission area of the first display element is greater than 1, and
a relative area of the second refraction area to an emission area of the second display element is less than 1.

13. A display apparatus comprising:
a display element disposed on a substrate and comprising an emission area;
a thin-film encapsulation layer disposed on the display element, the thin-film encapsulation layer comprising:
at least one inorganic encapsulation layer; and
at least one organic encapsulation layer;
a first insulating layer disposed on the thin-film encapsulation layer, the first insulating layer comprising:
an opening that corresponds to the emission area; and
a refraction area defined by the opening and comprising an organic material; and
a second insulating layer disposed on the first insulating layer, filling the refraction area, and having a refractive index greater than a refractive index of the first insulating layer, wherein the display element comprises a first display element and a second display element, the refraction area has a circular shape, a polygonal shape having eight or more sides, or an elliptical shape in a plan view, the refraction area comprising:

a first refraction area corresponding to the first display element; and a second refraction area corresponding to the second display element, the first refraction area and the second refraction area are different in at least one of a relative size to a corresponding emission area, a shape, and an arrangement, the first refraction area and the second refraction area have a circular shape or a polygonal shape having eight or more sides in a plan view, a relative area of the first refraction area to an emission area of the first display element is greater than 1, and a relative area of the second refraction area to an emission area of the second display element is less than 1.

* * * * *